(12) United States Patent
Thiagarajan et al.

(10) Patent No.: US 10,732,241 B2
(45) Date of Patent: Aug. 4, 2020

(54) SYSTEM AND METHOD FOR MANUFACTURING MAGNETIC RESONANCE IMAGING GRADIENT COIL ASSEMBLIES

(71) Applicant: GE Precision Healthcare LLC, Wauwatosa, WI (US)

(72) Inventors: Naveenan Thiagarajan, Schenectady, NY (US); Eric George Budesheim, Wynantskill, NY (US); Dominic Michael Graziani, Loudonville, NY (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 305 days.

(21) Appl. No.: 15/487,258

(22) Filed: Apr. 13, 2017

(65) Prior Publication Data

US 2017/0219668 A1    Aug. 3, 2017

Related U.S. Application Data

(63) Continuation-in-part of application No. 13/859,586, filed on Apr. 9, 2013, now Pat. No. 9,869,734.

(51) Int. Cl.
*G01R 33/385* (2006.01)
*B29C 64/10* (2017.01)
(Continued)

(52) U.S. Cl.
CPC ........... *G01R 33/3858* (2013.01); *B05D 7/22* (2013.01); *B29C 64/10* (2017.08); *B29C 64/188* (2017.08);
(Continued)

(58) Field of Classification Search
CPC .............. G01R 33/385; G01R 33/3856; G01R 33/3858; H01F 41/02; H01F 41/04; B29C 64/10; B29C 64/188; B05D 7/22
See application file for complete search history.

(56) References Cited

U.S. PATENT DOCUMENTS 6,368,530 B1   4/2002   Adubato et al.
7,135,863 B2   11/2006  Arik et al.
(Continued)

OTHER PUBLICATIONS

Bey-Oueslati, R.; Martel, S.; Therriault, D. Micro Heat Pipe Fabrication: High Performance Deposition Platform for Electronic Industry. NanoRobotics 2006 (Year: 2006).*
(Continued)

*Primary Examiner* — William P Fletcher, III
(74) *Attorney, Agent, or Firm* — Armstrong Teasdale LLP

(57) ABSTRACT

A method of manufacturing includes producing a gradient coil assembly having one or more cooling channels for a magnetic resonance imaging system by a process that includes printing a cooling channel template having a first end, a second end, and a hollow passage extending between the first end and the second end, disposing a dielectric material over at least a portion of the cooling channel template to generate a dielectric layer having the cooling channel template, and removing the cooling channel template from the dielectric layer to thereby produce the one or more cooling channels within the dielectric layer such that the one or more cooling channels have a pattern corresponding to a geometry of the cooling channel template.

17 Claims, 14 Drawing Sheets

(51) Int. Cl.
    *B29C 64/188*     (2017.01)
    *H01F 41/02*     (2006.01)
    *H01F 41/04*     (2006.01)
    *B05D 7/22*     (2006.01)

(52) U.S. Cl.
    CPC .............. *H01F 41/02* (2013.01); *H01F 41/04* (2013.01); *G01R 33/3856* (2013.01)

(56) References Cited

U.S. PATENT DOCUMENTS

| | | | |
|---|---|---|---|
| 8,922,072 B2 | 12/2014 | Bott et al. | |
| 9,028,744 B2 | 5/2015 | Durocher et al. | |
| 2008/0204179 A1* | 8/2008 | Schuster | F28F 3/12 336/57 |
| 2008/0206539 A1* | 8/2008 | Kobrin | B81B 3/0075 428/220 |
| 2009/0230975 A1* | 9/2009 | Yamada | G01R 1/0735 324/537 |
| 2012/0092105 A1 | 4/2012 | Weinberg et al. | |
| 2014/0302258 A1 | 10/2014 | Mathieu et al. | |
| 2015/0289413 A1 | 10/2015 | Rush et al. | |
| 2016/0339546 A1 | 11/2016 | Sung et al. | |

OTHER PUBLICATIONS

Sachs, Emanuel, et al.; "Production of Injection Molding Tooling with Conformal Cooling Channels using The Three Dimensional Printing Process", pp. 448-467, http://sffsymposium.engr.utexas.edu/Manuscripts/1995/1995-56-Sachs.pdf.

Bey-Oueslati, Ramzi, et al.; "Micro Heat Pipe Fabrication: High Performance Deposition Platform for Electronic Industry", http://citeseerx.ist.psu.edu/viewdoc/download;jsessionid=96BDD80F0B2A7181EC07E632A9648629?doi=10.1.1.453.903&rep=rep1&type=pdf (retrieved 2016).

Therriault, Daniel, et al.; "Rheological Behavior of Fugitive Organic Inks for Direct-Write Assembly", Applied Rheology, 2007, pp. 10112-1-8, vol. 17, Issue 1, http://colloids.matse.illinois.edu/articles/therriault_applrheol_2007.pdf.

* cited by examiner

SYSTEM AND METHOD FOR MANUFACTURING MAGNETIC RESONANCE IMAGING GRADIENT COIL ASSEMBLIES

CROSS REFERENCE TO RELATED APPLICATIONS

This is a continuation in part of U.S. patent application Ser. No. 13/859,586, entitled "SYSTEM AND METHOD FOR MANUFACTURING MAGNETIC RESONANCE IMAGING GRADIENT COIL ASSEMBLIES", filed Apr. 9, 2013 and issued as U.S. Pat. No. 9,869,734, which is herein incorporated by reference.

BACKGROUND

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Magnetic Resonance Imaging (MRI) systems enable imaging based on a primary magnetic field, a radio frequency (RF) pulse, and time-varying magnetic gradient fields that interact with specific nuclear components in an object, such as hydrogen nuclei in water molecules. The magnetic moments of such nuclei may generally align with the primary magnetic field, but subsequently precess about the bulk magnetic field direction at a characteristic frequency known as the Larmor frequency. An RF pulse at or near the Larmor frequency of such nuclei may cause their magnetic moments to be rotated. When the RF pulse has ended, the magnetic moments relax and generally align with the primary magnetic field, emitting a detectable signal.

Some of the magnetic gradient fields in MRI are produced by a series of gradient coils. In particular, the gradient coils create magnetic fields of varying strength along various imaging planes to produce a gradient along each plane. Nuclei of interest (e.g., hydrogen) align their spins according to the gradients. This results in spatial encoding, where spatial information about the location of the excited hydrogen nuclei can be obtained during acquisitions. Strong amplifiers power the gradient coils, allowing them to rapidly and precisely adjust the magnetic field gradients.

Generally, gradient coils for conventional cylindrical whole body magnetic resonance imaging (MRI) systems are manufactured by laying machined or wound electrical conductor material that has been rolled into a cylindrical shape onto a cylindrical former. Planar and other non-right circular cylindrical geometries for the gradient coils are also used for MRI. The teachings in this application herein do not preclude its use in non-right circular cylindrical geometries and are in fact applicable to other geometries. Moreover, various other layers including spacers, dielectric insulators, cooling features, passive shim bars, resistive shim assemblies, and RF shield are laid onto the cylindrical former to complete a gradient coil assembly. The performance of the gradient coils is dependent, at least in part, on the precise alignment of the layers before being fixed or bound to the cylindrical former. In addition, the manner in which the gradient coils are formed may affect their durability. For example, the durability of the gradient coils may decrease due to stress resulting from winding or otherwise bending the coils to a desired shape. Furthermore, additional gradient coil features (e.g. soldering pads, connecting leads, jumpers and barbs) are brazed onto the MRI gradient boards, which can introduce weak points into the coil assembly. Unfortunately, many of the above processes may be performed by hand, which can introduce manufacturer error and uncertainty into the overall manufacturing process.

BRIEF DESCRIPTION

In one embodiment, a method of manufacturing includes producing a gradient coil assembly having one or more cooling channels for a magnetic resonance imaging system by a process that includes printing a cooling channel template having a first end, a second end, and a hollow passage extending between the first end and the second end, disposing a dielectric material over at least a portion of the cooling channel template to generate a dielectric layer having the cooling channel template, and removing the cooling channel template from the dielectric layer to thereby produce the one or more cooling channels within the dielectric layer such that the one or more cooling channels have a pattern corresponding to a geometry of the cooling channel template.

In another embodiment, a method includes printing a dissolvable polymeric material onto a working surface of a 3D printing system to generate a cooling channel template having a pattern representative of one or more cooling channels of a gradient board. The cooling channel template includes a first end, a second end, and a hollow passage extending between the first end and the second end. The method also includes potting the cooling channel template with a dielectric material to generate a dielectric layer having the cooling channel template, removing the cooling channel template from the dielectric layer to generate a dielectric layer having a plurality of integral cooling channels created by removal of the cooling channel template, and integrating the dielectric layer into the gradient board, the gradient board having gradient coils for a magnetic resonance imaging (MRI) system.

In a further embodiment, a gradient coil assembly for a magnetic resonance imaging (MRI) system manufactured via a process including printing, using an additive manufacturing system, a cooling channel template having a first end, a second end, and a hollow passage extending between the first end and the second end. The cooling channel template is representative of a pattern of one or more cooling channels of the gradient coil assembly. The process also includes potting the cooling channel template with a dielectric material to generate a dielectric layer having the cooling channel template, and dissolving the cooling channel template in the dielectric layer to create the one or more cooling channels in the dielectric layer. The dielectric layer includes one or more gradient coils configured for use with the MRI system.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
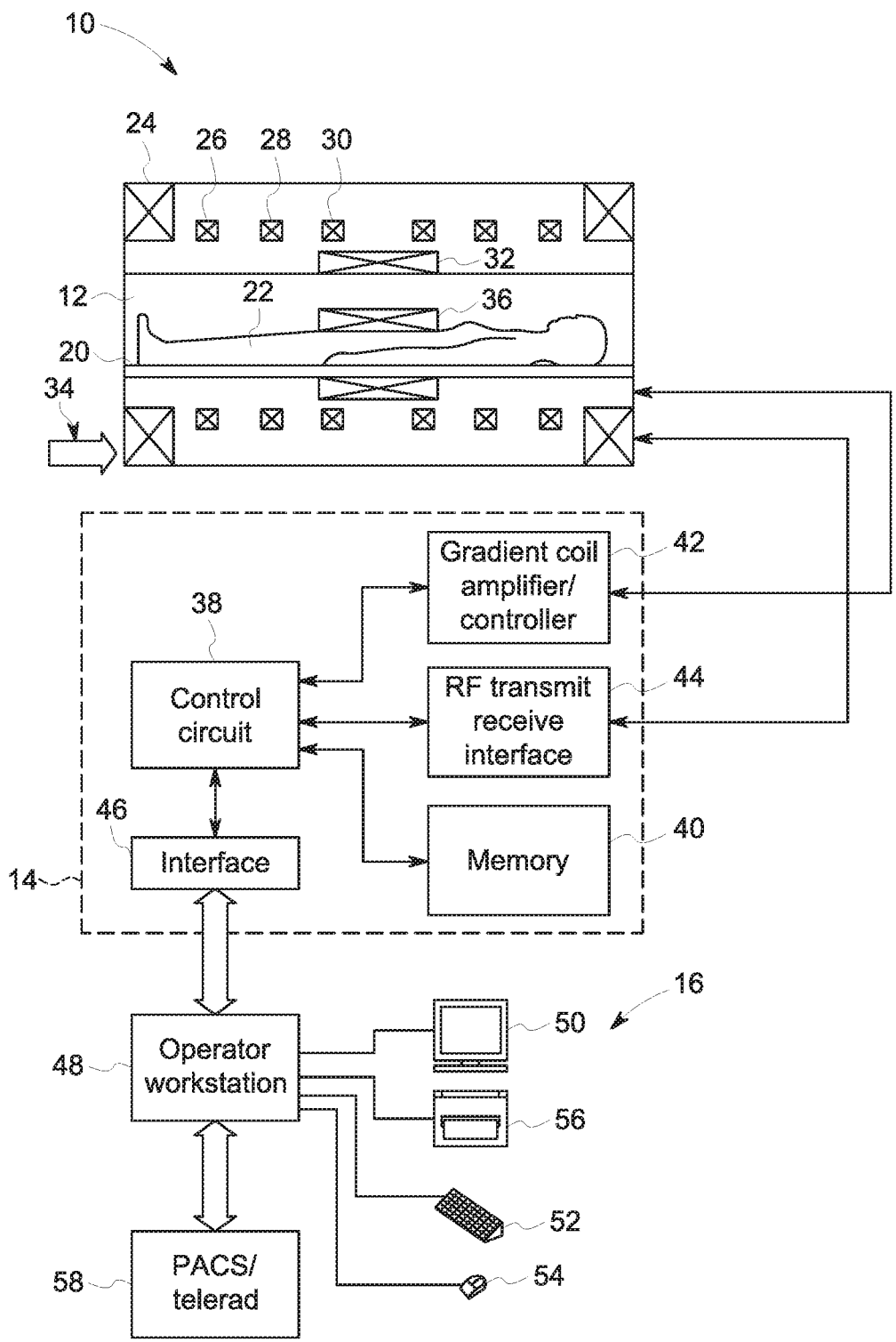
FIG. 1 is a diagram of an embodiment of a MRI system utilizing one or more gradient coils.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

As noted above, certain processes used to manufacture gradient coil assemblies can be costly, can introduce structural weaknesses into the assemblies, and may result in certain manufacturing defects. Accordingly, it may be desirable to manufacture gradient coil assemblies automatically and in a manner that results in less susceptibility to manufacturing defects and structural instabilities. The present disclosure provides embodiments directed toward manufacturing gradient coil assemblies using one or more additive manufacturing techniques.

For example, the present disclosure provides embodiments for manufacturing gradient coils using electron beam deposition, laser powder deposition, or ultrasonic consolidation. One or more additional additive manufacturing techniques may be used to combine the gradient coils with other gradient coil assembly features, such as spacers, windings, dielectric insulators, and so on. Indeed, in one embodiment, a gradient assembly may be automatically built using an automated gradient coil assembly manufacturing system, which may result in reduced manufacturing time while enhancing manufacturing precision, process control, and reliability compared to more traditional manufacturing approaches, such as manual winding and assembly.

Again, the gradient coil assemblies disclosed herein may be utilized in any magnetic resonance system, such as those commonly used in medical imaging. Turning now to the drawings, and referring first to FIG. 1, an embodiment of such an MRI system 10 is illustrated diagrammatically as including a scanner 12, scanner control circuitry 14, and system control circuitry 16. While the MRI system 10 may include any suitable MRI scanner or detector, in the illustrated embodiment the system includes a full body scanner having a table 20 positioned to place a patient 22 in a desired position for scanning.

The scanner 12 may include a series of associated coils for producing controlled magnetic fields, for generating radio frequency (RF) excitation pulses, and for detecting emissions from gyromagnetic material within the patient in response to such pulses. In the diagrammatical view of FIG. 1, a main magnet 24 is provided for generating a primary magnetic field. A series of gradient coils 26, 28 and 30 are grouped in one or more gradient coil assemblies for generating controlled magnetic gradient fields during examination sequences. An RF coil 32 is provided for generating RF pulses for exciting the gyromagnetic material. Power may be supplied to the scanner 12 in any appropriate manner, as indicated generally at reference numeral 34. In the embodiment illustrated in FIG. 1, the RF coil 32 may also serve as a receiving coil. Thus, the RF coil 32 may be coupled with driving and receiving circuitry in passive and active modes for receiving emissions from the gyromagnetic material and for applying RF excitation pulses, respectively. Alternatively, various configurations of receiving coils 36 may be provided separate from RF coil 32. Such coils may include structures specifically adapted for target anatomies, such as head coil assemblies. Moreover, receiving coils may be provided in any suitable physical configuration, including phased array coils.

In accordance with an embodiment, the gradient coils 26, 28, and 30 may each be formed using conductive wires, bars, plates or sheets to form a coil structure, which generates a gradient field upon application of control pulses. The placement of the gradient coils 26, 28, and 30 within the gradient coil assembly may be done in several different orders and with varying configurations, and the scanner 12 may further include complementary gradient coils to shield the gradient coils 26, 28, and 30. In some embodiments, the gradient coil 26 may be a z-gradient positioned at an outermost location compared to the gradient coils 28 and 30. The gradient coils 28 and 30 may be x-axis and y-axis coils, respectively.

The gradient coils 26, 28, and 30 of the scanner 12 may be controlled by external circuitry to generate desired fields and pulses, and to read signals from the gyromagnetic material in a controlled manner. The gradient coils 26, 28, and 30 may also serve to generate precisely controlled magnetic fields, the strength of which vary over a predefined field of view, typically with positive and negative polarity. When each gradient coil 26, 28, or 30 is energized with known electric current, the resulting magnetic field gradient is superimposed over the primary field and produces a desirably linear variation in the axial component of the magnetic field strength across the field of view. The field may vary linearly in one direction, but may be homogenous in the other two. The three gradient coils 26, 28, and 30 may have mutually orthogonal axes for the direction of their variation, enabling a linear field gradient to be imposed in an arbitrary direction with an appropriate combination of the three gradient coils 26, 28, and 30.

The pulsed gradient fields may perform various functions integral to the imaging process. Some of these functions are slice selection, frequency encoding and/or phase encoding. These functions can be applied along the x-, y- and z-axes of the original coordinate system or along other axes determined by combinations of pulsed currents applied to the individual field coils.

The coils of the scanner 12 are controlled by the scanner control circuitry 14 to generate the desired magnetic field and radiofrequency pulses. In the embodiment of FIG. 1, the control circuitry 14 thus includes a control circuit 38 for commanding the pulse sequences employed during the examinations, and for processing received signals. The control circuit 38 may include any suitable programmable logic device, such as a CPU or digital signal processor of a general purpose or application-specific computer. Further, the control circuit 38 may include memory circuitry 40, such as volatile and/or non-volatile memory devices for storing physical and logical axis configuration parameters, examination pulse sequence descriptions, acquired image data, programming routines, and so forth, used during the examination sequences implemented by the scanner 12.

Interface between the control circuit 38 and the coils of the scanner 12 may be managed by amplification and control circuitry 42 and by transmission and receive interface circuitry 44. The amplification and control circuitry 42 includes amplifiers for each gradient field coil 26, 28, and 30 to supply drive current in response to control signals from the control circuit 38. The receive interface circuitry 44 includes additional amplification circuitry for driving the RF coil 32. Moreover, where the RF coil 32 serves both to emit the RF excitation pulses and to receive MR signals, the receive interface circuitry 44 may include a switching device for toggling the RF coil between active or transmitting mode, and passive or receiving mode. A power supply, denoted generally by reference numeral 34 in FIG. 1, is provided for energizing the primary magnet 24. Finally, the scanner control circuitry 14 includes interface components 46 for exchanging configuration and image data with the system control circuitry 16.

The system control circuitry 16 may include a wide range of devices for facilitating interface between an operator or radiologist and the scanner 12 via the scanner control circuitry 14. In the illustrated embodiment, for example, an operator workstation 48 is provided in the form of a computer workstation employing a general purpose or application-specific computer. The operator workstation 48 also typically includes memory circuitry for storing examination pulse sequence descriptions, examination protocols, user and patient data, image data, both raw and processed, and so forth. The operator workstation 48 may further include various interface and peripheral drivers for receiving and exchanging data with local and remote devices. In the illustrated embodiment, such devices include a monitor 50, a conventional computer keyboard 52, and an alternative input device such as a mouse 54. A printer 56 is provided for generating hard copy output of documents and images reconstructed from the acquired data. In addition, the system 10 may include various local and remote image access and examination control devices, represented generally by reference numeral 58 in FIG. 1. Such devices may include picture archiving and communication systems, teleradiology systems, and the like.

Figure 2:
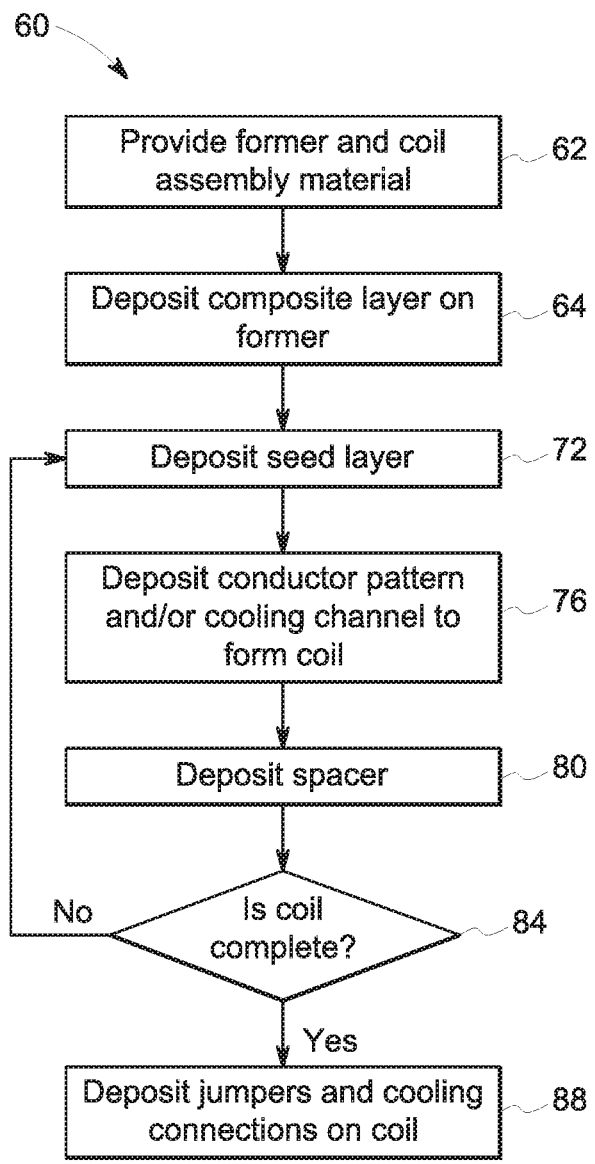
FIG. 2 is a process-flow diagram of an embodiment of a method for manufacturing MRI gradient coil assemblies having cooling channels.

As noted above, the present disclosure provides, among other things, techniques that may be used to construct gradient coil assemblies, such as a gradient coil assembly including gradient coils 26, 28, and 30, in a manner that enables the gradient coil assemblies to be built in an automated system. The automated system may construct the gradient coil assemblies layer by layer, while also constructing the coils in a wide variety of geometries. One such approach is depicted in FIG. 2, which illustrates an embodiment of a method 60 to construct the gradient coil assembly having coils 26, 28, and 30 used in the MRI system 10 of FIG. 1. In addition, to facilitate discussion of aspects of the method 60, reference is made to corresponding structures resulting from the acts of the method 60 in FIGS. 3-9. It should be noted that the method 60 may be performed automatically, such as by an automated system as described in detail with respect to FIG. 10, by a user, or both. Indeed, any one or a combination of the method steps described herein may be performed by such a system, which may include one or more tangible, non-transitory, machine-readable media storing one or more sets of instructions, and one or more processing devices configured to execute the one or more sets of instructions, where the one or more sets of instructions, when executed, perform the automated steps described herein.

The method 60 includes providing a former, a substrate material, which may include a fiberglass reinforced polymer or any other non-conductive durable materials suitable for supporting and/or housing a gradient coil assembly, and a conductor (e.g., coil) material, such as aluminum, copper, their respective alloys, or any other suitable conductive material that may be used to form a gradient coil (block 62). The method 60 also includes depositing the substrate material on the former/mandrel (block 64) to produce a base layer to form a flat or cylindrical gradient coil board.

Figure 3:
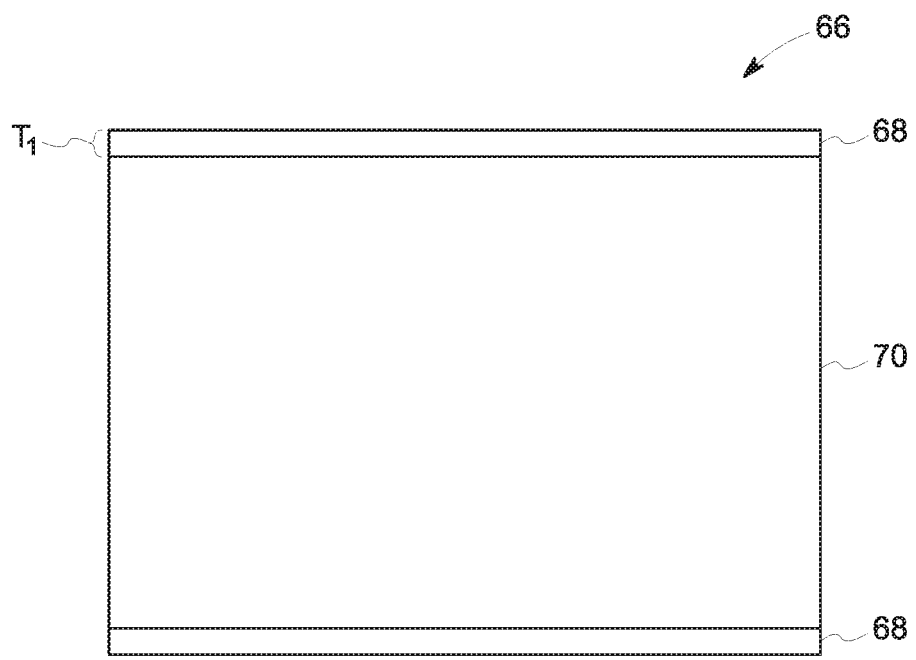
FIG. 3 is a cross-sectional view of an embodiment of a gradient coil assembly resulting from steps of the method of FIG. 2.

One embodiment of a structure resulting from the acts of block 64 is decpited in FIG. 3. In particular, FIG. 3 illustrates a cross-sectional view of an embodiment of a gradient board 66 having a base layer 68 (e.g., a substrate layer) deposited onto a mandrel 70 and having a desired thickness $T_1$. As discussed above, the composite or base material may include fiber reinforced polymers such as, but not limited to, epoxy, vinylester, and polyester thermosets, phenyl formaldehyde resins, polyurethanes, furans, polyimides, or any other suitable polymer having fibers including, but not limited to, glass, aramid, carbon, boron, or any combination thereof. It should be appreciated that the fibers may be impregnated, pre-impregnated, or post impregnated with the desired polymer and/or resin. Any suitable composite winding process (e.g., filament winding) may be used to deposit the composite material onto the mandrel 70 to yield the gradient coil board 66. The fibers in each of the layers of former material in the base layer 68 may be oriented in the same direction or may be oriented in different directions. That is, each layer may have a fiber orientation different from the previous layer. The base layer 68 may be cured using physical or chemical processes known to those skilled in the art once the desired thickness $T_1$ has been achieved. In one embodiment, the base layer 68 may be cured (e.g., in an oven) after deposition of each layer of base material in the base layer 68. In other embodiments the base layer 68 may be cured after several layers of base material have been deposited in the base layer 68. For example, the base layer 68 may be cured after 10%, 25%, 75%, and/or 100% of the thickness $T_1$ has been achieved. In other embodiments, the base layer 68 may be cured after completion of the gradient board assembly.

Figure 4:
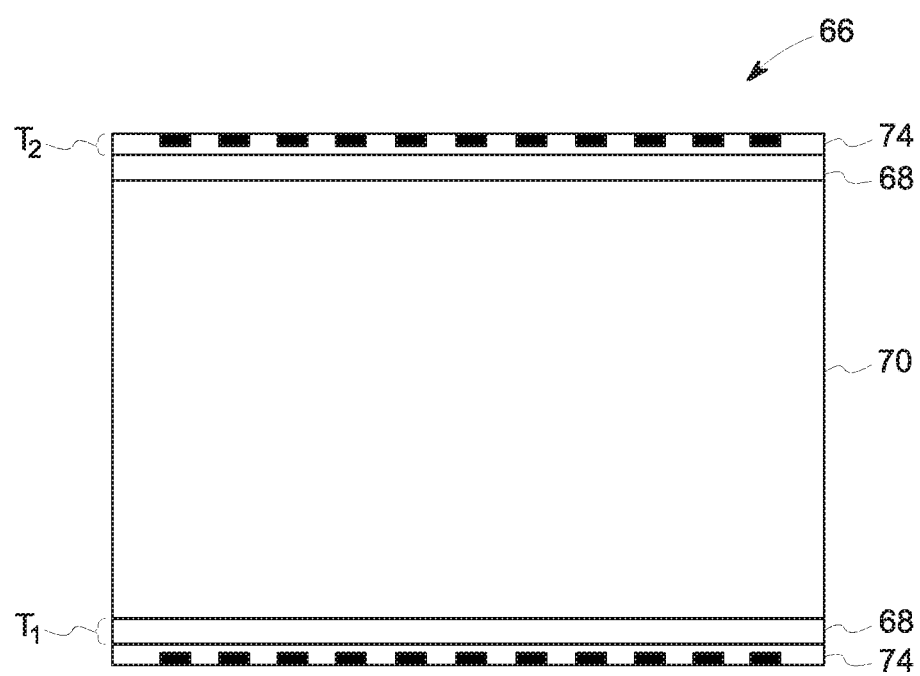
FIG. 4 is a cross-sectional view of an embodiment of a gradient coil assembly having a bonding layer deposited according to the method of FIG. 2.

Returning to the method 60 in FIG. 2, following deposition of the base layer 68, a conductive bonding layer is deposited onto the base layer 68 (block 72). In accordance with block 72, as depicted in FIG. 4, a bonding layer 74 is deposited onto the base layer 68 of the gradient board 66. The bonding layer 74 may include a radio frequency (RF) shield material such as, but not limited to, copper, nickel, aluminum, and their alloys, metal clad materials, metal inks or a combination thereof. Furthermore, the bonding layer may have a thickness $T_2$ that may be similar or different than the thickness $T_1$ of the base layer 68 and may be of any design. For example, the bonding layer 74 design may include a conductive mesh and/or sheet, such that high frequency RF signals can be contained within its boundaries. In other words, in one embodiment, the bonding layer 74 may be a Faraday shield. Deposition of the bonding layer 74 may be performed by a cold spraying process (e.g., gas dynamic cold spray) however, any other suitable spray process may be utilized. After deposition of the bonding layer 74, an additional layer of the base material may be deposited to seal the bonding layer 74 and fill in any voids resulting from the particular bonding layer design.

Figure 5:
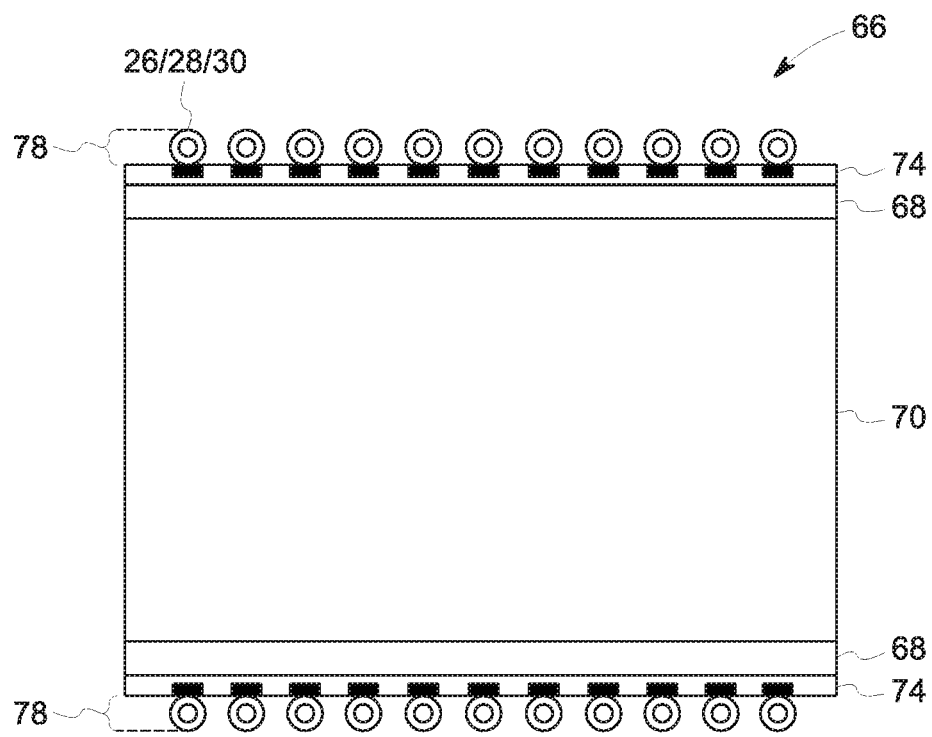
FIG. 5 is a cross-sectional view of an embodiment of a gradient coil board having MRI gradient coils with cooling channels deposited according to the method of FIG. 2.
Figure 6:
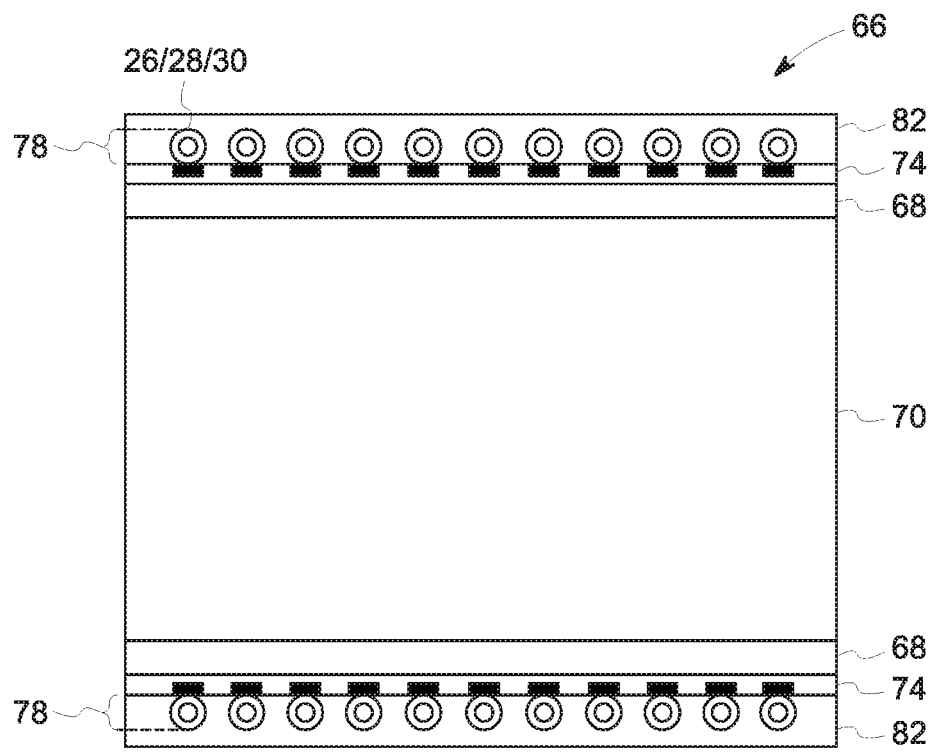
FIG. 6; is a cross-sectional view of an embodiment of an MRI gradient coil board having a spacer deposited according to the method of FIG. 2.
Figure 7:
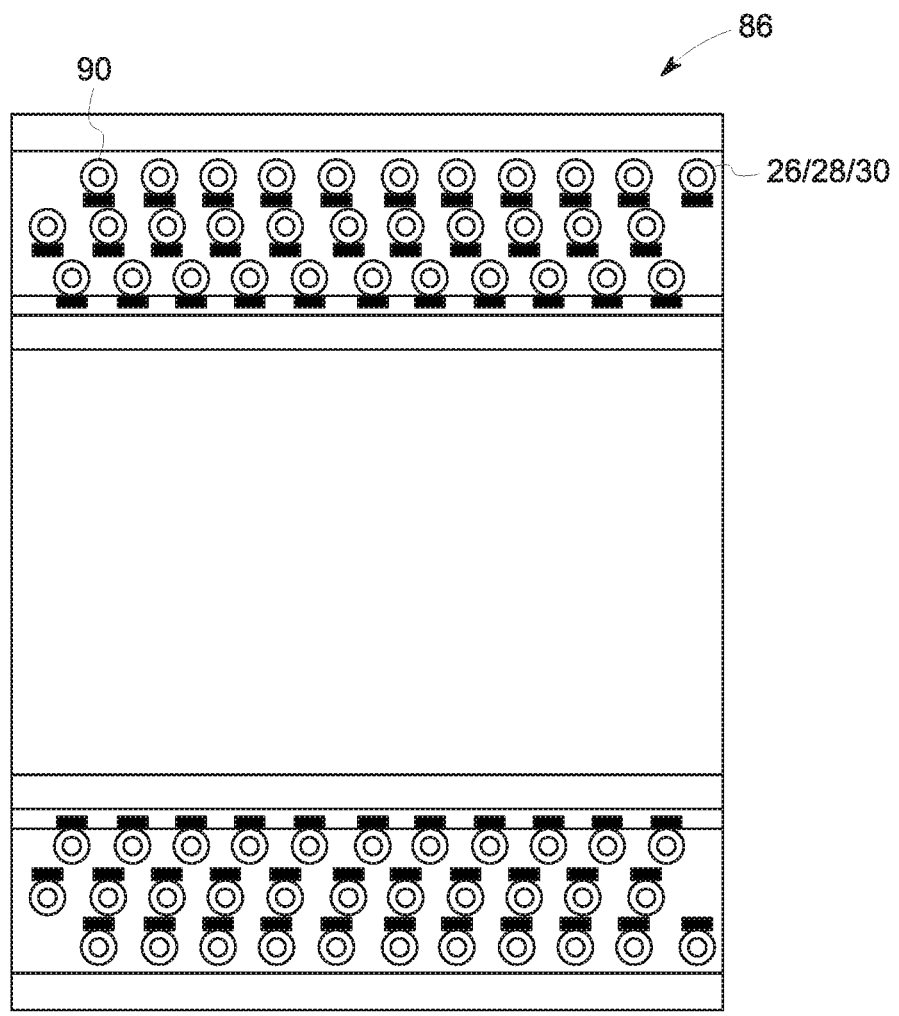
FIG. 7 is a cross-sectional view of an MRI gradient coil board resulting from various steps of the method of FIG. 2.

Turning once again to the method 60 in FIG. 2, following deposition of the bonding layer 74, conductor and cooling channel patterns are deposited (block 76) to form gradient coil geometries (e.g., gradient coils 26, 28, 30 of FIG. 1) and/or resistive shim coil geometries on the gradient board 66. FIG. 5 is a cross-sectional view of an embodiment of the gradient board 66 on the mandrel 70 having the base layer 68, the bonding layer 74, and a gradient coil (or resistive shim coil) layer 78 resulting from the performance of the acts of block 76. It should be noted that to facilitate discussion, certain embodiments described herein are presented in the context of including gradient coils (e.g., within the gradient coil layer 78). However, it should also be noted that any one or a combination of the gradient coil layers (e.g., layer 78) disclosed herein may, additionally or alternatively, include one or more resistive shim coils. Accordingly, while gradient coils may be specifically referenced below, the incorporation of resistive shim coils is also presently contemplated.

The conductor material used to produce the gradient or resistive shim coils may be deposited using various metal deposition methods such as, but not limited to, ultrasonic consolidation, laser sintering, laser cladding, conductive ink printing, and/or electron beam welding to form the gradient (or resistive shim) coils 26, 28, and 30. In one embodiment, the gradient coil layer 78 is deposited using ultrasonic consolidation, as discussed below with respect to FIGS. 8 and 9. Further, the same deposition method can be used to connect the different sections of the cooling or electrical conductor pattern and provide leads, jumpers, and coolant fittings before, during, or after forming the gradient coil geometries.

Figure 8:
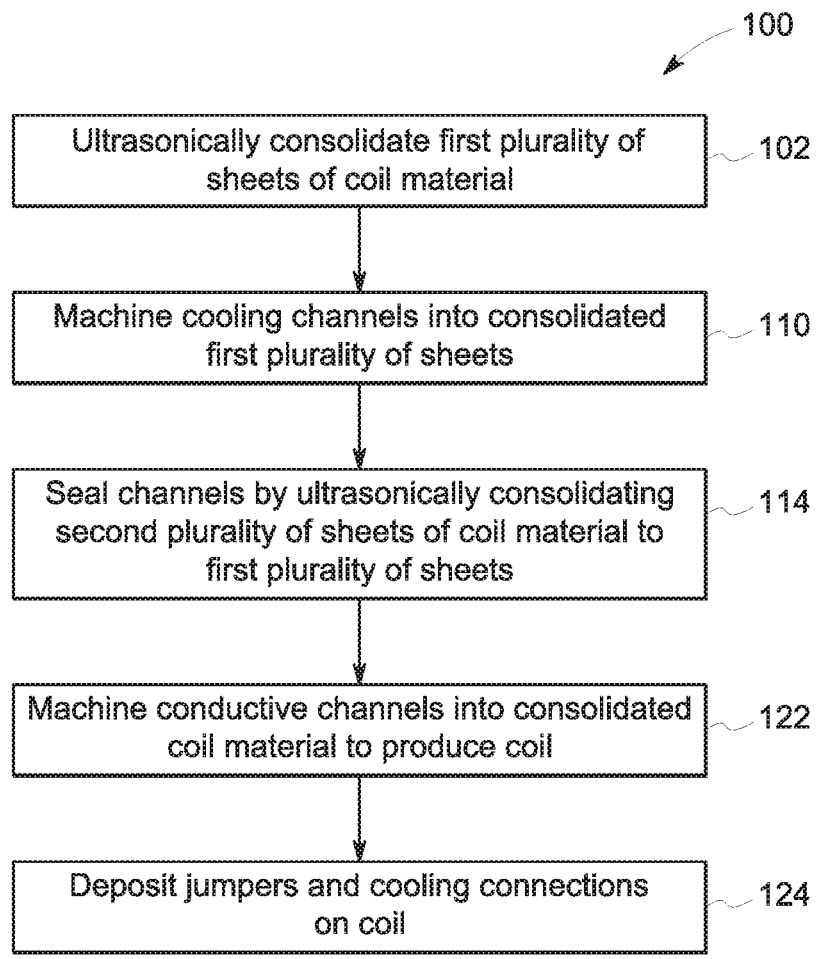
FIG. 8 is a process-flow diagram of an embodiment of a method for manufacturing the MRI gradient coils with cooling channels depicted in FIG. 5.

Referring back to the method 60 in FIG. 2, upon completion of the gradient coil layer 78, a dielectric spacer layer is deposited (block 80). A cross-sectional view of the gradient board 66 including the mandrel 70, the base layer 68, the gradient coil layer 78, the bonding layer 74, and a dielectric spacer layer 82 deposited according to block 80, is illustrated in FIG. 8. As depicted, the dielectric spacer layer 82 may provide additional structural support for the board 66, and may fill voids between portions of the gradient coil layer 78 (e.g., to provide a substantially flat or continuous surface). Furthermore, the dielectric spacer layer 82 may electrically isolate the gradient coils 26, 28, and 30 from external electrical conductors, such as those used to provide current to the gradient coils 26, 28, and 30, except at contact points where electrical current is provided to and from the coils.

Deposition of the dielectric spacer layer 82 may be achieved using any process suitable for depositing dielectric materials. For example, in certain embodiments, the dielectric spacer layer 82 may be deposited using a printer head or a spray process. The dielectric spacer layer 82 may include material having high dielectric (e.g., electrically insulative) properties, such as, but not limited to, a ceramic or a ceramic/epoxy composite, or any other suitable composite materials. Furthermore, the dielectric spacer layer 82 may include a combination of layers made using a dielectric material and the base material. In some embodiments, the dielectric spacer layer 82 may be disposed onto the gradient coil layer 78 prior to deposition of subsequent gradient coil layers 78 to prevent shorting between gradient coil layers.

Following deposition of the dielectric spacer layer 82 according to block 80, the method 60 includes determining (query 84) whether the coil assembly is complete. For example, in embodiments in which the method 60 is automated, the control circuitry of the automated system may determine whether the coil has the predefined geometries, number of conductive and/or insulative layers, or the like. For example, in one embodiment, additional bonding layers 74, gradient coil layers 78, and dielectric spacer layers 82 may be used to complete the gradient coil board 66. Therefore steps 72, 76, and 80 of the method 60 may be repeated until the system determines that the gradient coil assembly is completed. One embodiment of a completed gradient coil assembly 86 having a pre-defined number of gradient coil layers 78, bonding layers 74, and spacer layers 82 is illustrated as a cross-sectional diagram in FIG. 7. It should be noted that the gradient coil assembly 86 may have any number of layers, such as 1, 2, 3, 4, 5, or more bonding, gradient, and/or dielectric spacer layers.

In addition to the layers discussed above, the gradient coil assembly 86 may have resistive shim assemblies and/or passive shim tooling bars deposited and distributed between each of the layers. For example, in certain embodiments, one or more resistive shim assemblies each having one or more resistive shim coils may be interleaved with one or more gradient coil layers according to block 76 of the method 60 (FIG. 2) in a similar manner as described above with respect to the gradient coil layer. Accordingly, after deposition of the dielectric spacer layer 82 (e.g., according to block 80 (FIG. 2)) and the bonding layer 74 (e.g., according to block 72 (FIG. 2)), the resistive shim assemblies having one or more inductors may be deposited. After deposition of the resistive shim assemblies, the acts according to blocks 72, 76, 80, and 84 may be repeated until a predetermined number of gradient coil layers and resistive shim assemblies are incorporated into the gradient coil assembly 86.

In other embodiments, fugitive inks may be deposited inside the bonding layer 74 to form shim pockets. In certain embodiments, the fugitive ink may also be used to form hollow conducting channels within the gradient board. The fugitive ink may be removed via chemical or physical methods (e.g., dissolution, flushing, ejecting, etc.) once the gradient coil assembly 86 is complete, leaving hollow cavities (e.g., shim pockets) within the bonding layer 76. Furthermore, the fugitive ink may be removed by using warm water to dissolve and flush out the fugitive ink from within the bonding layer 74. In other embodiments, an abrasive slurry (e.g., a sand-water mixture) may be passed through at a pressure such that it removes the fugitive ink and smooths out the shim pockets or any other hollow cavities such as the conducting channels within the gradient coil assembly 86.

Once it is determined, in query 84, that the coil assembly 86 is complete, jumpers and cooling connections may be deposited onto the gradient coil assembly 86 (block 88), though it should be appreciated that such connections may be deposited during deposition of the gradient coil layers 78. It should be noted that prior to deposition of the jumpers and/or cooling connections, a layer of base material (e.g., similar to or the same as the base layer 70) may be deposited. The jumpers, cooling connections, and other similar connectors may be formed using the metal deposition techniques discussed above (e.g., ultrasonic consolidation, laser sintering, laser cladding, electron beam wire deposition). Accordingly, three-dimensional features such as electrical connectors, inlet connectors, and outlet connectors may be deposited onto the gradient coil assembly 86 without soldering and/or brazing the connectors, which may enhance durability.

Because the connectors may be used for coupling to cooling fluid sources, the connectors may include internal fluid paths, which enable the flow of the coolant into cooling channels 90 of the coils. Furthermore, the connectors may have geometries that are more conducive for securing with external cooling and/or electrical sources. For example, the connectors may have smooth and/or rounded edges, smooth threads, or a combination thereof, such that tube fittings may be used to secure the tubing from the cooling source to the connectors. As noted above, upon complete deposition of the jumpers and/or cooling connector (e.g., after all layers of the gradient coil assembly 86 are in place), the gradient coil assembly 86 may be placed in an oven or other suitable heating source to cure any remaining uncured composite material (e.g., former material).

As set forth above with respect to block 76 of FIG. 2, in certain embodiments, ultrasonic consolidation may be utilized to deposit conductive channels for use as gradient coils in the gradient coil assembly 86. FIG. 8 illustrates an embodiment of a method 100 for constructing the gradient coils 26, 28, and 30 using ultrasonic consolidation. In addition, to facilitate discussion of aspects of the method 100, reference is made to corresponding structures resulting from the acts of the method 100 in FIG. 9.

Figure 9:
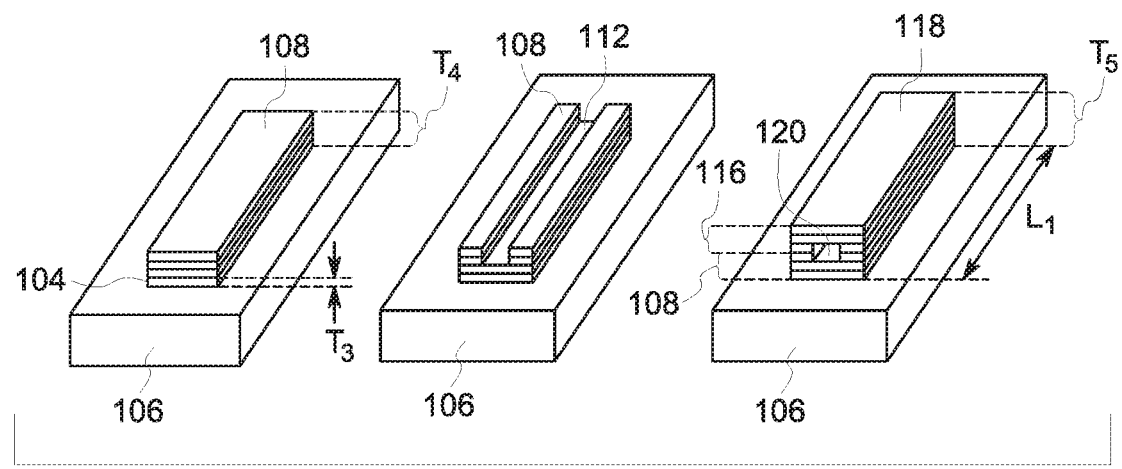
FIG. 9; is a diagrammatical illustration of an embodiment of an MRI gradient coil resulting from various steps of the method of FIG. 8.

The method 100 includes depositing a first plurality of sheets of a conductor material (e.g., the coil material) onto a substrate (e.g., the base layer or the seed layer), and ultrasonically consolidating the first plurality of sheets of the conductor material together to form a structure (block 102). For example, with reference to FIG. 9, the configuration resulting from the acts of block 102 are depicted. Moving from left to right, the diagram in FIG. 9 illustrates a first plurality of metal sheets 104 having a desired thickness $T_3$ deposited onto a substrate 106 (e.g., the bonding layer 74 in FIG. 4), according to the acts of block 102. The thickness $T_3$ of the first plurality of metal sheets 104 may be any suitable size, such as between 0.02 and 0.001 inches, 0.012 and 0.003 inches, 0.009 and 0.005 inches, or approximately 0.006 inches. The metal sheets may include any conductive material suitable for ultrasonic consolidation to produce the gradient coils 26, 28, and 30. By way of example, such materials may include highly conductive metals such as 101 OFHC copper, aluminum, and their respective alloys, among others. By applying a suitable amount of force and ultrasonic vibrations (e.g., a frequency of approximately 20 kHz) to each metal layer, the first plurality of metal sheets 104 are consolidated to form a first consolidated structure 108 having a thickness $T_4$ of approximately 1 to 10 mm.

Returning to the method 100 of FIG. 8, following consolidation of the first plurality of metal sheets, cooling channels are machined into the consolidated structure (block 110). In accordance with block 110, as depicted in the middle structure in FIG. 9, a cavity 112 is machined into the first consolidated structure 108. The cavity 112 may be used to generally define the size (e.g., cross-sectional area) of one or more internal cooling channels formed into the coil resulting from the method 100. Accordingly, the size of the cavity 112 will generally correspond to the size of the cooling channel. While any relative size is presently contemplated, by way of non-limiting example, the thickness of the cavity 112 may be at least approximately 10% of the thickness of the first consolidated structure 108, such as between approximately 10% and 90% of the thickness, between approximately 20% and 80% of the thickness, or between approximately 30% and 60% of the thickness of the first consolidated structure 108.

Returning again to the method 100 of FIG. 8, upon machining in accordance with block 110, the method 100 includes sealing the machined cooling channels by ultrasonically consolidating a second plurality of sheets of the conductor material to the first plurality of sheets of the conductor material (block 114). Referring again to FIG. 9, referring to the structure at the right, a second plurality of metal sheets 116 are consolidated to the first plurality of metal sheets 108 to form a second consolidated structure 118 having a thickness $T_5$ and a cooling channel 120, according to block 114. The second consolidated structure 118 may have a constant or variable cross section and may have a desired length $L_1$ and thickness $T_5$. It should be appreciated that the consolidated structure 118 may have more than one cooling channel 120. The cooling channels may be equal, meaning each channel has the same dimensions, or they may have variable dimensions, where each channel has different dimensions, or a combination thereof.

Returning to FIG. 8, the method 100 also includes machining conductive channels into the sealed consolidated structure to produce a coil (block 122). For example, the machining performed in accordance with block 122 may produce one or more desired coil geometries, such as curves, bends, varying angles and turning radii, and so on.

Before, during, or after forming the desired coil geometries, electrical connectors, jumpers, and cooling fluid connectors may be deposited onto the coil (block 124). For example, using ultrasonic consolidation, one or more connector features may be consolidated to the existing structure, obviating the use of solder, or other similar joint mechanisms.

As also noted above, in certain embodiments, in addition to, or in lieu of using ultrasonic consolidation, the gradient coils 26, 28, and 30 may be deposited using laser powder deposition (LPD) or electron beam melting (EBM). To facilitate discussion of certain aspects of these methods, reference will be made to the structures in FIG. 9. In such methods, a focused laser/electron beam melts, sinters, or otherwise consolidates a portion of the bonding layer 74 such that the conductor material (e.g., in the form of a powder or wire) introduced at the junction between the laser/electron beam and the surface of the bonding layer 74 may be fused onto the surface of the bonding layer 74. Subsequent layers of conductor material are deposited in a similar manner; that is, each layer of the conductor material is fused to a desired portion of the preceding layer to produce a consolidated structure similar to the middle structure seen in FIG. 9. Cooling channels may be incorporated into the consolidated structure by advanced tool path planning or introducing a sacrificial material such as, but not limited to, a fluid (e.g., water), fugitive ink, polymer, and/or metal with low melting point into the cavity 112 prior to deposition of additional layers of the conductive material that seal the cavity 112 to produce the consolidated structure 118. The sacrificial material may be removed via physical and/or chemical processes (e.g., dissolution, flushing, ejecting, etc.) from the consolidated structure 118 resulting in the cooling channel 120. In yet further embodiments, the cavity 112 may be formed by etching the first consolidated structure 108 using the laser/electron beam.

The gradient coils 26, 28, and 30 produced from the methods and techniques described above may have relatively simple geometries (e.g., substantially straight or having relatively simple bends or turns) or more complex geometries (e.g., a plurality of turns having different directions or geometries). For example, in one embodiment, the gradient coils 26, 28, and 30 may have a round cross-sectional geometry. Moreover, as discussed above, the geometry of the cooling channels may be equal or may have variable dimensions, or a combination thereof. Furthermore, the cooling channels may diverge or converge at a turn spacing of the gradient coil assembly 86 so as to enable a desired flow of a cooling fluid through the channels and suitable contact between the cooling fluid and the surface of the gradient coils 26, 28, and 30.

Figure 10:
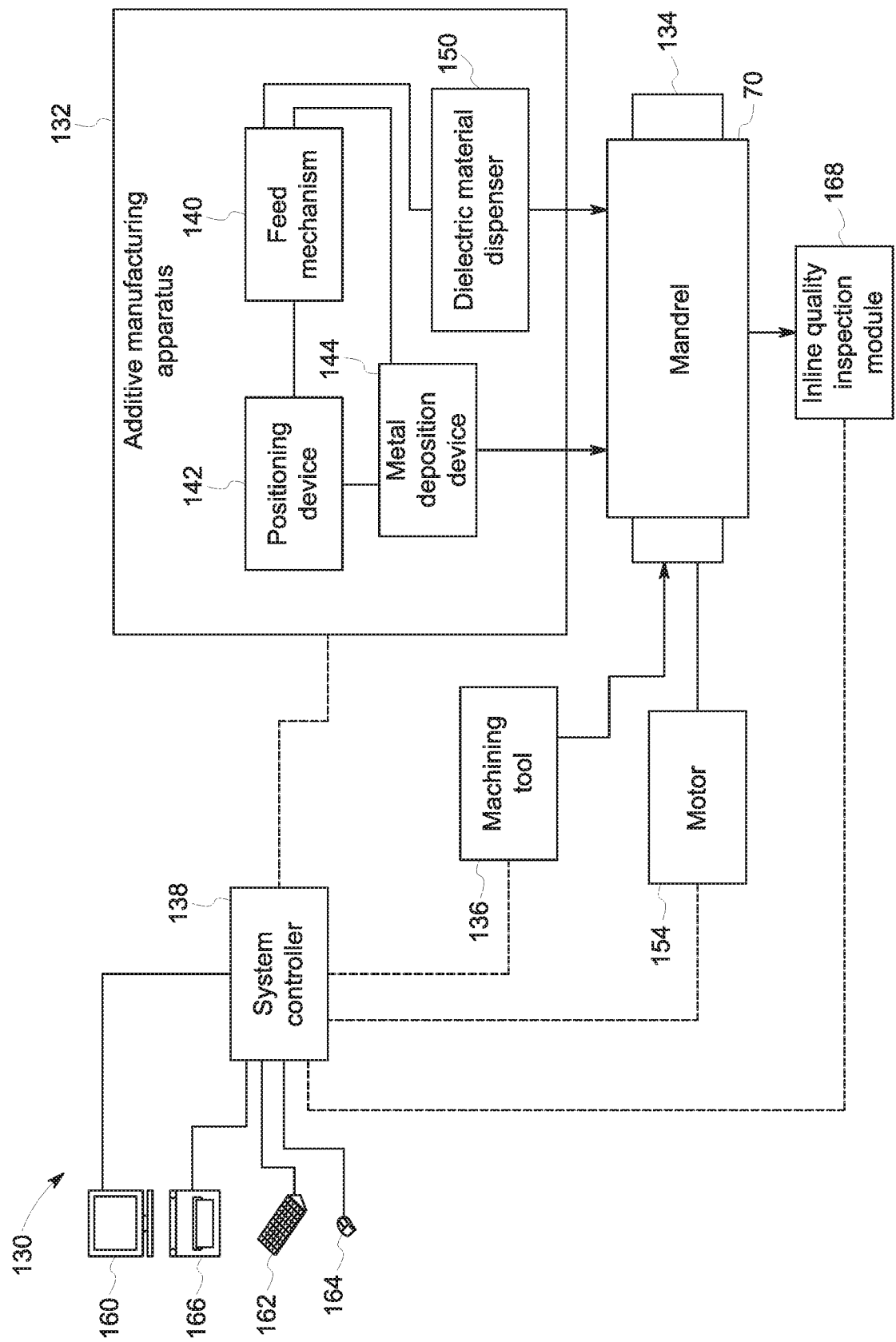
FIG. 10 is a diagrammatical illustration of an embodiment of a system used to manufacture MRI gradient coil assemblies.

As noted above, the embodiments described herein enable the manufacturing of gradient coil assemblies used in MRI systems using additive manufacturing techniques. One system capable of such manufacturing is depicted in FIG. 10. In particular, FIG. 10 is an embodiment of an additive manufacturing system 130 that performs the methods of FIGS. 2 and 8. The additive manufacturing system 130 includes an additive manufacturing apparatus 132, a consolidation platform 134, a machining tool 136, and a system controller 138. The additive manufacturing housing 132 further includes a feed mechanism 140, a positioning device 142, a metal deposition device 144, and a dielectric material dispenser 150. The feed mechanism 140 is configured to supply the positioning device 142, the metal deposition device 144, and/or the dielectric material dispenser 150 with materials used to build the gradient coil assembly, such as the gradient coil assembly 86 depicted in FIG. 7. For example, the feed mechanism 140 may supply an electrically conductive material including, but not limited to, metals such as aluminum, copper and/or their alloys, electrically conductive composite materials, or a combination thereof, to build a consolidated structure to form an inductor. The conductive material may be in the form of a sheet, ribbon, tape, wire, powder, or any combination thereof. In other embodiments, the feed mechanism 140 may supply dielectric materials, such as ceramics and/or ceramic epoxies to the dielectric material dispenser 150 to form a dielectric spacer layer (e.g., dielectric spacer layer 82 of FIG. 7).

The positioning device 142, during operation, positions various materials (e.g., coil material, dielectric spacer material, substrate material) according to information received from the system controller 138. For example, as discussed in further detail below, a coil design may be input via a computer-assisted drawing program and provided to the system controller 138, which may in turn command operation of the system 130 to construct the coil board/assembly according to the predefined geometric specifications. In particular, the system controller 138 may command the operation of the positioning device 142 to move certain features of the additive manufacturing apparatus 132, such as the metal deposition device 144 and/or the dielectric material dispenser 150.

In constructing the gradient coils, for instance, the positioning device 142 may move the metal deposition device 144 (e.g., an ultrasonic consolidation head, a laser, or an electron beam emission device) to a point on a base layer, such as the base layer 68 in FIG. 3, on the mandrel 70 supported by the consolidation platform 134. The metal deposition device 144 may deposit the conductive material, supplied by the feed mechanism 140, onto the base layer 68. The metal deposition device 144 then consolidates the conductive material to, and, along with the machining tool 136, forms the conductive and cooling channels of the gradient coils 26, 28, and 30. As set forth above, in one embodiment, the metal deposition device 144 is an ultrasonic consolidator. The ultrasonic consolidator applies force (e.g., approximately 1000-3000 N) and ultrasonic vibrations (e.g., frequency approximately 20 kHz, amplitude between 10 and 50 µm) to the conductive material to consolidate each layer of the conductive material and form the inductor, such as the consolidated structure 118 depicted in FIG. 9. In other embodiments, the metal deposition device 144 includes a laser emitter or electron beam emitter that melts, sinters, brazes, fuses, or otherwise consolidates each layer of the electrically conductive material to yield the consolidated structure 118 depicted in FIG. 9.

In constructing the coil assemblies, the positioning device 142 may move in concert with the mandrel 70, which may be coupled to a motor 154. The system controller 138 may control the mandrel 70 to cause the mandrel 70 to rotate and translate on the consolidation platform 134, thereby enabling construction of the inductor and cooling channels on a gradient coil board (e.g., gradient board 66 in FIG. 5). Again, the machining tool 136, working in concert with the metal deposition device 144, may machine desired inductor and cooling channel patterns into the consolidated conductive materials. For example, when the metal deposition device 144 consolidates the conductive material, the machining tool 136 may machine the inductor and/or cooling channel patterns according to information received from the system controller 138.

As discussed above with respect to the method 60 of FIG. 2, upon completion of the inductor and cooling channels, the dielectric material dispenser 150 deposits the dielectric spacer layer 82. The dielectric material dispenser 150 receives a dielectric material, such as but not limited to, ceramic, ceramic/epoxy composites, or any other suitable dielectric material, from the feed mechanism 140. The dielectric material dispenser 150 may deposit the dielectric material onto the gradient board using a spray mechanism, or any other suitable dielectric deposition mechanism.

As noted above, predetermined geometries for the various layers of the gradient coil assemblies may be input to the system controller 138, which enables the system controller 138 to in turn command the operation of various features of the additive manufacturing apparatus 132 to construct the desired gradient coil assembly. Accordingly, the additive manufacturing system 130 may also include features that enable a user to interface with the system controller 138 and other devices of the system 130. For example, the system controller 138 may include devices employing a general purpose or an application-specific computer, both of which may include memory circuitry for storing gradient coil parameters such as inductor, cooling channel, connector geometries and patterns, and images (e.g., of a desired conductor configuration). The system controller 138 also may include a computer numerical controller (CNC) for the automated manufacturing of gradient coil boards. The CNC may enable enhanced accuracy, automation, and repeatable construction of inductor and cooling channels (e.g., the same type of inductor and/or cooling channel can be made each time) compared to more traditional construction methods such as hand winding, which in turn improves quality control and the overall efficacy of the gradient boards.

The system controller 138 may include a wide range of devices for facilitating interface between an operator and the additive manufacturing system 130. In the illustrated embodiment, for example, the devices include a monitor 160, a conventional computer keyboard 162, and an alternative input device such as a mouse 164. For example, the system controller 138 may include a computer assisted drawing or modeling program enabling a user to define various coil and layer geometries. A printer 166 may be used to generate hard copy outputs of inductor, cooling channel, and/or connector parameters, geometries, and images of gradient coil board designs.

The system controller 138 may also receive information indicative of the quality of the inductor and cooling channels from an inline quality inspection module 168. For example, the inline quality inspection module 168 may provide information about the conductor, cooling channel, and connector geometries to the control system 138, therefore the control system 138 may compare the received information to specifications ranges stored in the memory circuitry and adjust the gradient coil parameters accordingly. In certain embodiments, the metal deposition device 144 may include integrated inspection sensors, such as optical charge-coupled devices, for monitoring and verification of the additive manufacturing steps. In certain embodiments, the quality inspection module 168 may provide feedback to the system controller 138 indicative of errors in construction. The controller 138 may use the feedback to adjust the operation of one or more features of the additive manufacturing apparatus 132 to meet the predefined specifications for the various geometries (e.g., of the coils, cooling channels, spacer layers) input into the system 130.

As discussed above, with respect to FIG. 8, the cavity 112 may be machined into the consolidated structure 108 to create the cooling channels 90 within the electrical circuit (e.g., the gradient coils 26, 28, 30) of the gradient board 66. In this way, the cooling channels 90 are defined by a hollow passage (e.g., the cavity 112) within each gradient coil 26, 28, 30. However, other embodiments of the present disclosure may include cooling channels that are separate from the electrical circuit. For example, the cooling channels may be integrated into a dielectric material that may form part of a dielectric spacer layer (e.g., the dielectric spacer layer 82) or a gradient coil layer (e.g., a layer having the gradient coils 26, 28, 30). As discussed in further detail below, the cooling channels may be integrated into the dielectric material using a subtractive process in conjunction with additive manufacturing processes (e.g., 3D printing) or other mold fabrication processes (e.g., cast molding, injection molding, etc.). Indeed, it is now recognized that separating the cooling channels from the electrical circuit can enable the formation of shorter more efficient cooling pathways. For instance, due, in part, to the length of the gradient coils 26, 28, 30, incorporating the cooling channels 90 within the electrical circuit may result in an undesirable pressure drop (e.g., greater than approximately 45 pounds per square inch (psi)).

Figure 11:
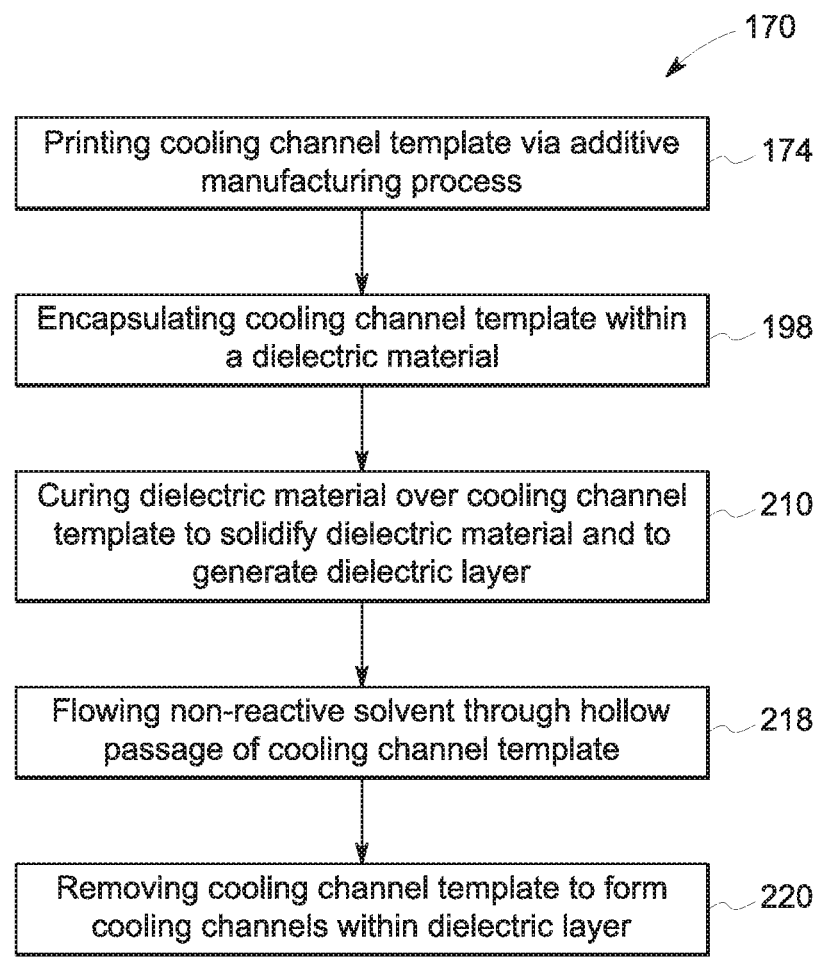
FIG. 11 is a process-flow diagram of an embodiment of a method for manufacturing a dielectric layer of MRI gradient coil assemblies having integral cooling channels.

FIG. 11 is a block diagram of an embodiment of a method 170 for constructing cooling channels integrated into a dielectric material of a gradient board (e.g., the gradient board 66). To facilitate discussion of aspects of the method 170, reference is made to corresponding structures in FIGS. 12-20 resulting from the acts of the method 170 in FIG. 11. The method 170 includes printing a sacrificial cooling channel template via an additive manufacturing process (block 174). For example, a layer of a working material may be deposited onto a working surface. The working surface as used herein may be a working platform of a 3D printing system (e.g., the additive manufacturing system 130) or a previously printed layer of the sacrificial cooling channel template. The 3D printing system may deposit a layer of working material on the working surface that is microns to millimeters thick. The working material may include a polymeric material or one or more monomers that are polymerized in situ to form the polymeric material. By way of non-limiting example, the working material may include polyvinyl alcohol (PVA), high impact polystyrene (HIPS), wax, acrylic polymers such as a terpolymer of methacrylic acid, styrene, and butylacrylate (e.g., P400-SR) and acrylic copolymers (e.g., SR-30) both available from Stratasys of Eden Prairie, Minn., or any other suitable soluble support material that readily dissolves in water or other non-reacting solvent.

The polymeric material may be deposited onto the working surface to print a layer of the sacrificial cooling channel template. Once the layer of the polymeric material has been deposited, it may be treated to solidify desired regions of the layer to form (e.g., define) a layer of the sacrificial cooling channel template. For example, the layer of the polymeric material may be treated with heat to cure the polymeric material. Additionally, or alternatively, the working material or monomers may be treated with light having a suitable wavelength (e.g., UV, visible) that initiates polymerization of the monomers to form the polymeric material. Following curing of the printed layer of the polymeric material, another layer of the polymeric material is deposited over the previous printed layer, the new layer is selectively cured, and the layer-by-layer process is repeated until the desired structure of the sacrificial cooling channel template is achieved. While the present embodiments are discussed are discussed in the context of using additive manufacturing to generate the cooling channel template, the sacrificial cooling channel template may be fabricated using any other suitable techniques. For example, the sacrificial cooling channel template may be fabricated via cast molding, injection molding, or any other suitable mold fabrication technique.

Figure 12:
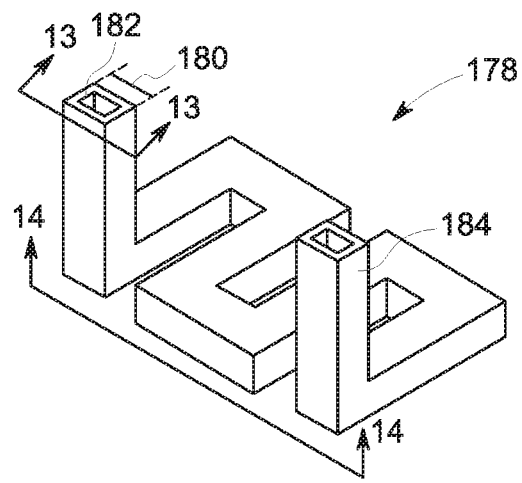
FIG. 12 is a perspective view of an embodiment of a cooling channel template resulting from steps of the method of FIG. 11.

For example, with reference to FIG. 12, a sacrificial cooling channel template resulting from the acts of block 174 is depicted. The illustrated sacrificial cooling channel template 178 may be used to form cooling channels that are integrated into a dielectric material of the gradient board (e.g., the gradient board 66). The sacrificial cooling channel template 178 represents a pattern and dimension of cooling channels that are to be integrated into the dielectric material. For example, the sacrificial cooling channel template 178 may have an outer dimension 180 that is equal to an inner dimension of the cooling channel that is to be formed by using the sacrificial cooling template 178. The sacrificial cooling channel template 178 may be printed to have any suitable pattern and geometry. By way of non-limiting example, the pattern of the sacrificial cooling template 178 may be such that the cooling channels have a serpentine or convoluted configuration. In certain embodiment, the sacrificial cooling channel template 178 may form cooling channels that are parallel to one another, in series, and/or split into multiple flow paths (e.g., bifurcate, trifurcate, etc.). The sacrificial cooling channel template 178 also includes a hollow passage 182. As discussed in further detail below, the hollow passage 182 may be used to flow a fluid (e.g., a non-reactive solvent) through the body of the template, which enables the solvent to remove (e.g., dissolve) the sacrificial cooling channel template 178 to form the cooling channels within the dielectric material.

The sacrificial cooling channel template 178 may have any desired cross-sectional geometry, examples of which are depicted along line 13-13 and line 14-14, to thereby produce cooling channels of desired cross-sectional geometries. By way of non-limiting example, the cross-sectional geometry of the sacrificial cooling channel template 178 along line 13-13 may be rectangular, circular, polygonal, triangular, or irregular (e.g., non-symmetrical). The cross-sectional geometry of the hollow passage 182 may be the same or different from the cross-sectional geometry defined by an outer wall 184 of the sacrificial cooling channel template 178. For example, the hollow passage 182 may have a rectangular cross-sectional geometry and the outer wall 184 may have a honeycomb cross-sectional geometry. The cross-sectional geometry of the sacrificial cooling channel template 178 defined by the outer wall 184 defines the cross-sectional geometry of the cooling channel that is to be integrated into the dielectric material of the gradient board.

Figure 13:
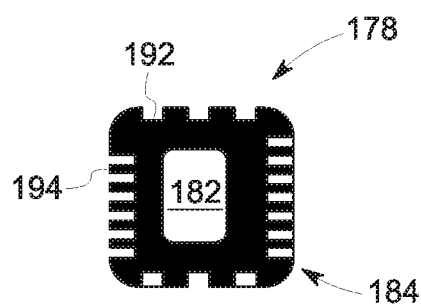
FIG. 13 is a cross-sectional top view of an embodiment of the cooling channel template of FIG. 12 resulting from the steps of the method of FIG. 11.

The acts according to block 174 of FIG. 11 may be performed such that a surface of the outer wall 184 may be smooth, as shown in FIG. 12, or textured. Further, combination of smooth and textured outer surfaces may be produced. FIG. 13 is a cross-sectional view along line 13-13 of FIG. 12, illustrating an embodiment of the sacrificial cooling channel template 178 having surface features on the outer wall 184. In the illustrated embodiment, the outer wall 184 of the sacrificial cooling channel template 178 includes recesses 192 and protrusions 194 (e.g., fins, bumps). The recesses 192 and protrusions 194 may have any suitable geometry such as rectangular, triangular, circular, polygonal, and combinations thereof. The recesses 192 and protrusions 194 may be disposed about at least a portion of a perimeter of the outer wall 184. As discussed in further detail below, the recesses 192 and the protrusions 194 result in surface features on an inner wall of the cooling channels generated using the sacrificial cooling channel template 178. The surface features in the cooling channels increase surface area and may create turbulent flow of cooling fluid flowing through the cooling channels during operation of the MRI system 10, thereby improving heat transfer and cooling efficiency of the cooling channels. By using additive manufacturing processes (e.g., 3D printing) to generate the sacrificial cooling channel template 178 the cooling channels formed from the sacrificial cooling channel template 178 may have geometries and intricacies that may otherwise be unavailable and that enable efficient cooling of the gradient coils 26, 28, 30.

Figure 14:
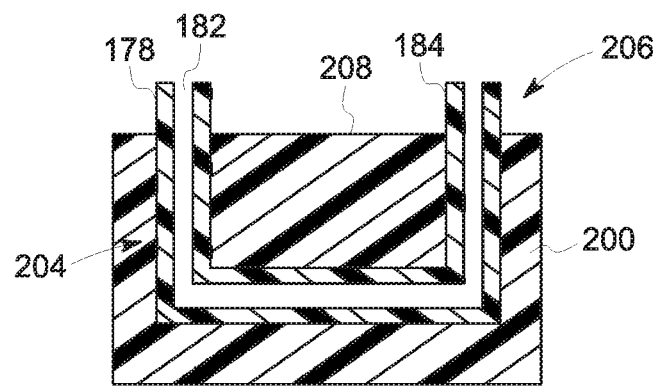
FIG. 14 is a cross-sectional elevation view of an embodiment of a dielectric layer having the cooling channel template of FIG. 12 resulting from various steps of the method of FIG. 11.
Figure 15:
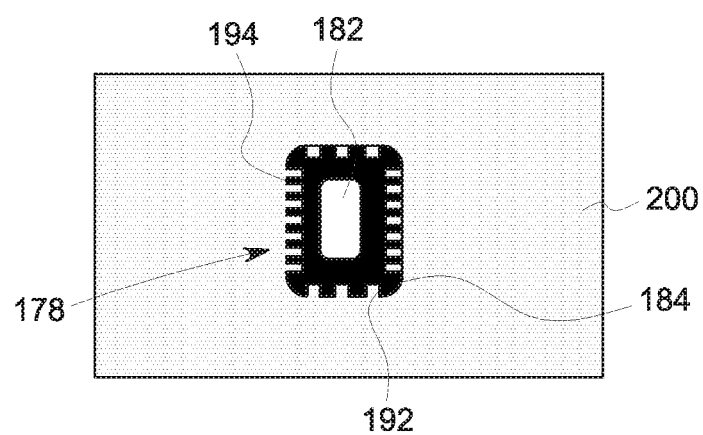
FIG. 15 is a cross-sectional top-view of an embodiment of the dielectric layer of FIG. 14 having the cooling channel template of FIG. 15 resulting from various steps of the method of FIG. 11.

Returning to the method of 170 of FIG. 11, following formation of the sacrificial cooling channel template 178 the sacrificial cooling channel template is at least partially encapsulated (e.g., potted, casted) with one or more dielectric materials (block 198). The sacrificial cooling channel template 178 may be potted with the dielectric material using vacuum impregnation processes or any other suitable potting process. FIGS. 14 and 15 illustrate structures resulting from the acts of block 198 of the method 170. For example, FIG. 14 is a cross-sectional elevation view of the sacrificial cooling channel template 178 along line 14-14 potted in a dielectric material 200. In the illustrated embodiment, at least a portion 204 of the sacrificial cooling channel template 178 is embedded within the dielectric material 200 and a portion 206 extending away from a surface 208 of the dielectric material 200 is not embedded in the dielectric material 200. Having the portion 206 extending away from the surface 208 of the dielectric material 200 may facilitate coupling the sacrificial cooling channel template 178 to a source of the fluid used to remove the sacrificial cooling channel template 178 from the dielectric material 200, as discussed in further detail below. In this particular embodiment, the portion 206 may be printed from a non-dissolvable material. The portion 206 may be separated (e.g., disconnected, pulled apart) from the dielectric material 200 after removal of the portion 204 of the sacrificial cooling channel template 178. In other embodiments, the portion 206 may also be embedded within the dielectric material 200.

FIG. 15 illustrates a cross-sectional top-view of the sacrificial cooling channel template 178 of FIG. 13. As shown in FIG. 15, the dielectric material 200 fills voids in the outer wall 184 of the sacrificial cooling channel template 178 created by the recesses 192, which results in surface features on the inner wall of the cooling channels (see, e.g., FIG. 19). The dielectric material 200 may include materials having high dielectric (e.g., electrically insulative) properties, such as, but not limited to, a ceramic, epoxies, polyurethane, or a ceramic/epoxy composite, or any other suitable composite materials. In certain embodiments, the dielectric material 200 may include fillers such as calcium carbonate, boron nitride, aluminum nitride, or any other suitable filler and combinations thereof.

Returning again to the method 170 of FIG. 11, following the acts of block 198, the method 170 includes curing the dielectric material 200 over at least a portion of the sacrificial cooling channel template 178 to solidify the dielectric material 200 and generate a first dielectric layer (block 210). The dielectric material 200 may be cured via heat, light, or any other suitable curing method. For example, in certain embodiments, the dielectric material 200 may include monomeric units that undergo polymerization in situ upon exposure to light to form a resin or composite material, thereby solidifying the dielectric material 200 to generate the first dielectric layer. In other embodiments, the dielectric material 200 may include ceramic materials that may be consolidated upon exposure to heat to form the dielectric layer.

Figure 16:
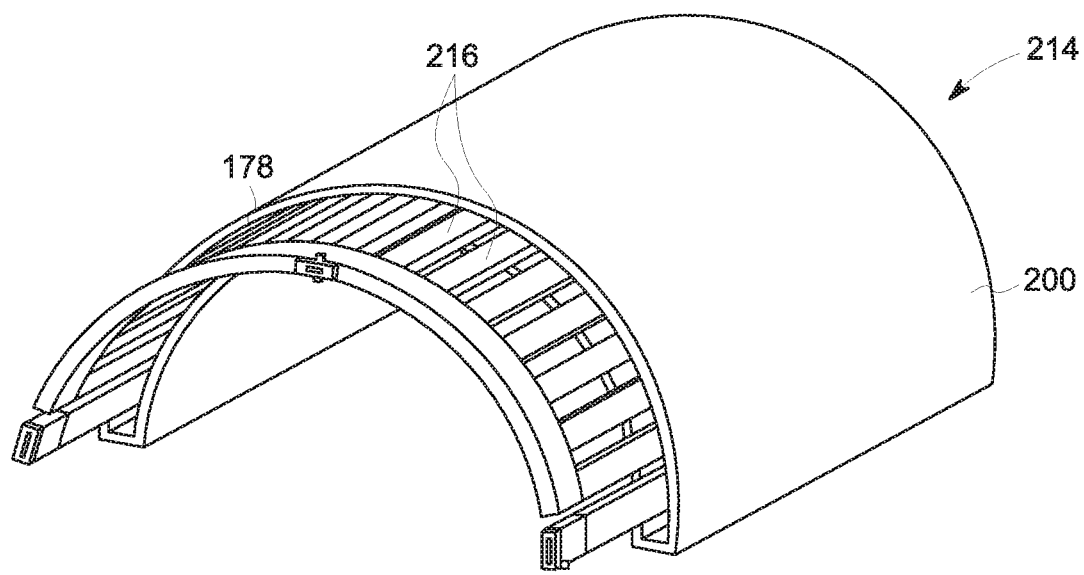
FIG. 16 is a perspective view of an embodiment of a dielectric layer of a gradient board having a cooling channel template.

During curing, the dielectric material 200 solidifies around the portion 204 of the sacrificial cooling channel template 178 to embed the sacrificial cooling channel template 178, 186 within the dielectric material 200. For example, FIG. 16 is a perspective view of a dielectric layer 214 having the sacrificial cooling channel template 178 embedded in the dielectric material 200. To facilitate discussion of FIG. 16, a portion of the dielectric material 200 has been omitted to view a portion of the embedded sacrificial cooling channel template 178 embedded (e.g., potted) within the dielectric material 200. In the illustrated embodiment, the sacrificial cooling channel template 178 includes multiple channels 216 arranged in a pattern that is representative of the cooling channels that are to be integrated into the dielectric layer 214 after removal of the sacrificial cooling channel template 178. The arrangement of the channels 216 is such that a flow of fluid through the hollow passage 182 of the channels 216 may be parallel or in series.

Returning to the method 170 of FIG. 11, following curing of the dielectric material 200 according to block 210, the method 170 includes flowing a non-reactive solvent through the hollow passages 182 of the sacrificial cooling channel template 178 (block 218) and removing the embedded sacrificial cooling channel template 178 to form cooling channels within the dielectric layer (block 220). As used herein, a "non-reactive solvent" is intended to denote a solvent that does not react with the dielectric material of the gradient coil assembly. The non-reactive solvent dissolves the material of the sacrificial cooling channel template 178, thereby leaving voids (e.g., passages) within the dielectric layer that define the cooling channels. In certain embodiment, the non-reactive solvent may be the same solvent used to generate the solution of the polymeric material used to print the sacrificial cooling channel template 178. In other embodiments, the non-reactive solvent may be a solvent that is different from the solvent used to generate the solution of the polymeric material used to print the sacrificial cooling channel template 178.

Figure 17:
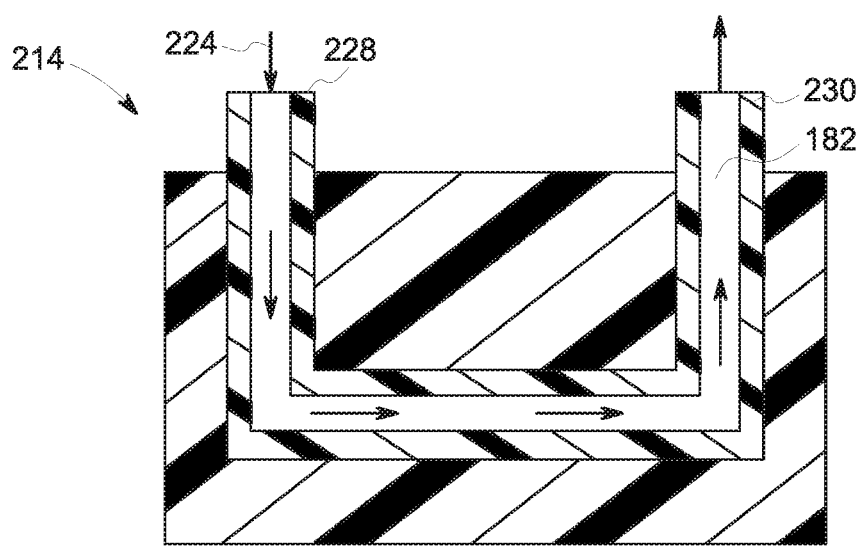
FIG. 17 is a cross-sectional side-view of an embodiment of the dielectric layer of FIG. 14, whereby a non-reactive solvent flows through a hollow passage of the cooling channel template.

For example, as shown in FIG. 17, the hollow passage 182 of the sacrificial cooling channel template 178 receives a non-reactive solvent 224 through a first end 228 (e.g., inlet) that is fluidly coupled to a source of fluid (e.g., reservoir) that supplies the non-reactive solvent 224 to the hollow passage 182. As the non-reactive solvent 224 flows through the hollow passage 182 and out a second end 230 (e.g., outlet) of the sacrificial cooling channel template 178 the non-reactive solvent 224 dissolves and removes the sacrificial cooling channel template 178 from the dielectric layer 210. Removal of the sacrificial cooling channel template 178 from the dielectric layer 214 forms voids that define internal cooling channels within the dielectric layer.

Figure 18:
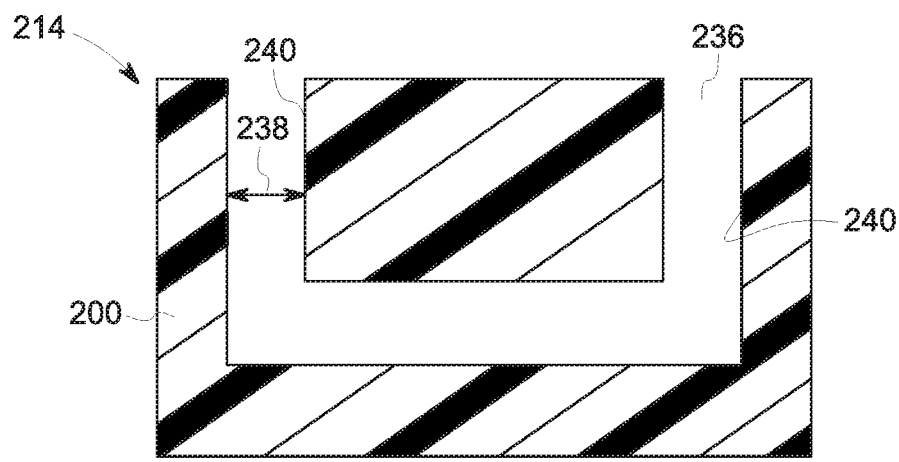
FIG. 18 is a cross-sectional elevation view of an embodiment of the dielectric layer of FIG. 14 having an integrated cooling channel resulting from various steps of the method of FIG. 11.

FIG. 18 is a cross-sectional elevation view of a portion of the dielectric layer 214 having integral cooling channels formed by the sacrificial cooling channel template 178, in accordance with the acts of blocks 218 and 220 of FIG. 11. The dielectric layer 214 includes a cooling channel 236 defined by inner wall 240 of the dielectric layer 214 and having a geometry and pattern defined by the sacrificial cooling channel template 178. The cooling channel 236 has an inner dimension 238 that is substantially equal to the outer dimension 180 of the sacrificial cooling channel template 178. Accordingly, in certain embodiments and by way of non-limiting example, the inner dimension 238 of the cooling channel 236 may be less than approximately 60 millimeters (mm), such as between approximately 0.5 mm and 60 mm. However, the inner dimension 238 may be any other suitable dimension that allows efficient cooling of the gradient coil assembly. By using the sacrificial cooling channel template 178 to generate the cooling channels in the dielectric layer 214, the cooling channel 236 may have a dimension and configuration that is not readily accessible using certain existing gradient board manufacturing processes.

As set forth above, the cooling channel 236 may have a cross-sectional geometry that is similar to the cross-sectional geometry of the sacrificial cooling channel template. For example, in embodiments where the sacrificial cooling channel template has a smooth (e.g., non-textured) outer wall surface, the cooling channel 236 may have a smooth internal wall 240.

Figure 19:
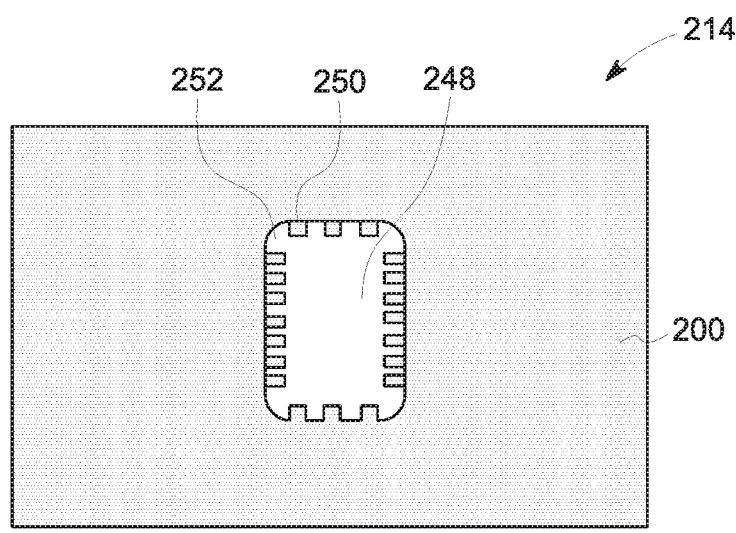
FIG. 19 is a cross-sectional top-view of an embodiment of the dielectric layer of FIG. 14 having an integrated cooling channel with surface features resulting from various steps of the method of FIG. 11.

In other embodiments, the cooling channel 236 may have a cross-sectional geometry having a pattern that is substantially opposite to a pattern defined by the outer wall 184 of the sacrificial cooling channel template. For example, FIG. 19 is a cross-sectional top view of an embodiment of the dielectric layer 214 with a cooling channel 248 having a cross-sectional geometry that is different from the sacrificial cooling channel template used to form the cooling channel 248 (the sacrificial cooling channel template 178 acts as a negative of the desired cooling channel geometry). As illustrated, a geometry of the cooling channel 248 is substantially the opposite of the geometry of the sacrificial cooling channel template 186 of FIG. 15 as defined by the outer wall 184. For example, the cooling channel 248 includes protrusions 250 and recesses 252 along the inner wall 240, 242 that correspond to the recesses 192 and protrusions 194, respectively, on the outer wall 184 of the sacrificial cooling channel template 186 of FIG. 15. The protrusions 250 and the recesses 252 on the inner wall 240, 242 of the cooling channel 248 may enhance cooling efficiency of the cooling channel 248 by increasing surface area and encouraging turbulent flow of the cooling fluid flowing through the cooling channel 248.

Figure 20:
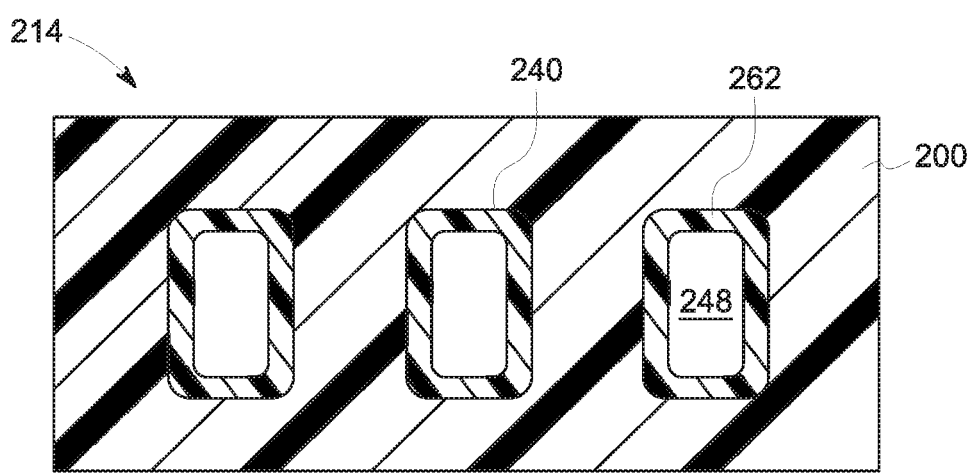
FIG. 20 is a cross-sectional elevation view of an embodiment of the dielectric layer of FIG. 14 having integrated cooling channels coated with a protective barrier.

As discussed above, the non-reactive solvent 224 removes the sacrificial cooling channel template 178, 186 from the dielectric material 200 to generate a dielectric layer having integral cooling channels (e.g., the cooling channels 236, 248). Therefore, the non-reactive solvent 224 used to remove the sacrificial cooling channel template 178 is selected based on the working material used to print the sacrificial cooling channel template 178. For example, the non-reactive solvent 224 may include a solvent that dissolves the polymeric material used to print the sacrificial cooling channel template 178 and does not react with the dielectric material 200. By way of non-limiting example, the non-reactive solvent 224 may include water, a sodium hydroxide solution, xylene, D-limonene, or any other suitable solvent and combinations thereof. In this way, the cooling channels 236, 248 may be integrated into the dielectric layer 214, as shown in FIG. 20. By using the sacrificial cooling channel template 178 to form cooling channels within the dielectric material of an MRI gradient board, undesirable pressure changes associated with cooling channels integrated into the circuit board (e.g., hollow passages of the gradient coils 26, 28, 30) may be mitigated. Additionally, due, in part, to the flexibility of 3D printing processes, the configurations and geometries of the sacrificial cooling channel templates 178 may result in cooling channels that have improved cooling efficiency. For example, the cooling channels may have surface features (e.g., the protrusions 250 and the recesses 252) that may increase surface area and create turbulent flow and enhance heat transfer between the cooling fluid and the gradient board.

In certain embodiments, the cooling channel 248 may be coated with a protective barrier to mitigate moisture absorption and/or corrosions of the dielectric material 200 resulting from the cooling fluid flowing through the cooling channel 248 during cooling of the gradient board. For example, FIG. 20 is a cross-sectional elevation view of an embodiment of the dielectric layer 214 having a protective barrier 262 coated on the inner wall 240 of the cooling channel 248. The protective barrier 262 may be coated onto the inner wall 240 after removal of the sacrificial cooling channel template 178 or during potting of the sacrificial cooling channel template 178.

For example, in one embodiment, following removal of the sacrificial cooling channel template 178 the protective barrier 262 may be coated onto the inner wall 240 of the cooling channel 248 via a vapor deposition process. In another embodiment, a solution of the protective barrier 262 may be circulated through the cooling channel 248. As the solution flows through the cooling channel 248, the protective barrier 262 may be deposited onto a surface of the inner wall 240. In this way, the protective barrier 262 may be coated onto the inner wall 240 of the cooling channel 248 after removal of the sacrificial cooling channel template 178.

Figure 21:
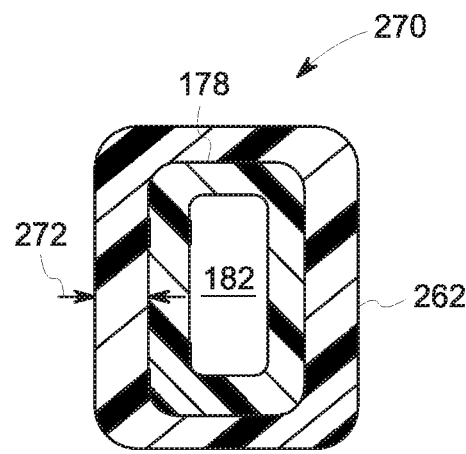
FIG. 21 is a cross-sectional elevation view of an embodiment of a cooling channel template, whereby an outer wall of the cooling channel template is coated with a protective barrier.

In other embodiments, the protective barrier 262 may be coated onto the sacrificial cooling channel template 178. For example, FIG. 21 is a cross-sectional elevation view of a coated sacrificial cooling channel template 270 having the sacrificial cooling channel template 178 and the protective barrier 262. The protective barrier 262 may be coated onto a surface of the outer wall 186 of the sacrificial cooling channel template 178. The protective barrier 262 may be coated onto the sacrificial cooling channel template 178 via vapor deposition, dip coating, spray coating, or any other suitable coating technique. A thickness 272 of the protective barrier 262 may be a thickness that is sufficient to last the expected operational lifetime of the gradient board, while still providing the desired protection of the dielectric material 200. By way of non-limiting example, the protective barrier 262 may include materials such as parylene, polyurethane, acrylic, or any other suitable material, and combinations thereof that block moisture absorption and corrosions of the gradient board.

During potting of the coated sacrificial cooling channel template 270, the dielectric material 200 may adhere to the protective barrier 262 on the outer wall 184 of the sacrificial cooling channel template 178. As discussed above, the sacrificial cooling channel template 178 is dissolved by the non-reactive solvent 224 to generate a dielectric layer having integral cooling channel 248, according to the acts of blocks 218 and 220 of the method 170 of FIG. 11. However, the protective barrier 262 is insoluble in the non-reactive solvent 224. As such, the protective barrier 262 remains within the cooling channel 248 after removal of the sacrificial cooling channel template 178.

Figure 22:
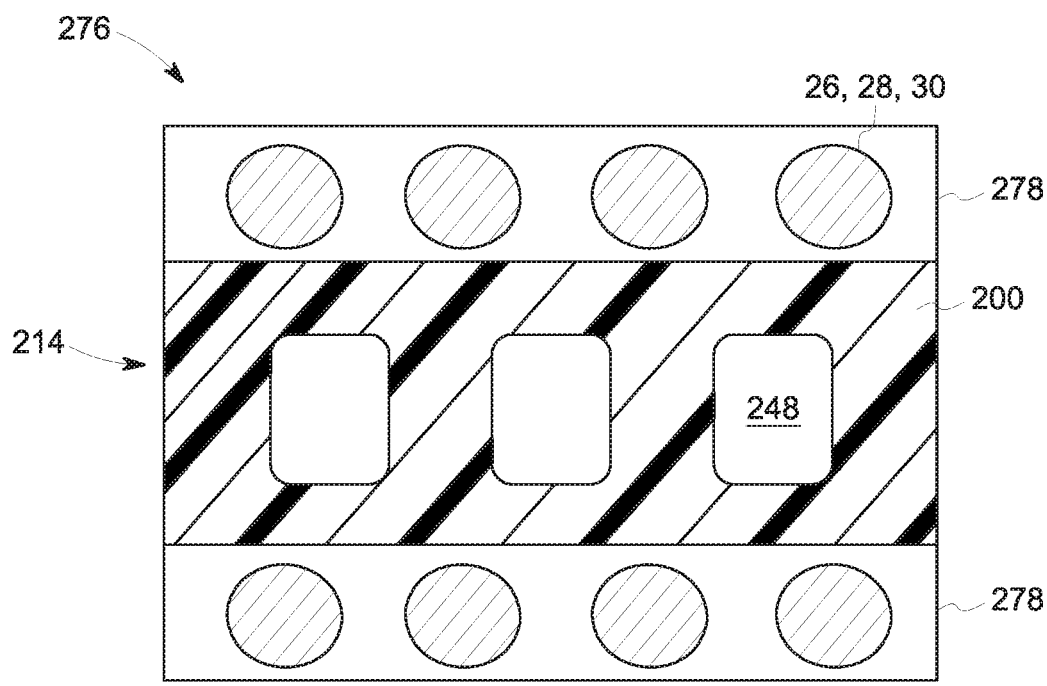
FIG. 22 is a cross-sectional elevation view of an embodiment of a gradient board having a dielectric layer having integrated cooling channels disposed between two gradient coil layers.

MRI gradient boards manufactured using the sacrificial cooling channel template 178 may have cooling channels disposed between two gradient coil layers or within the gradient coil layer. For example, FIG. 22 illustrates a cross-sectional elevation view of a gradient board 276 having the dielectric layer 214 with cooling channels 248 positioned between two gradient coil layers 278 that include the gradient coils 26, 28, 30. In the illustrated embodiment, the gradient coils 26, 28, 30 are shown as solid coils. However, in certain embodiments, the gradient coils 26, 28, 30 may have a hollow core. It should be appreciated that the cooling channels 248 in the illustrated embodiment may include the protective barrier 262, and may have any one or a combination of the cross-sectional geometries set forth above.

Figure 23:
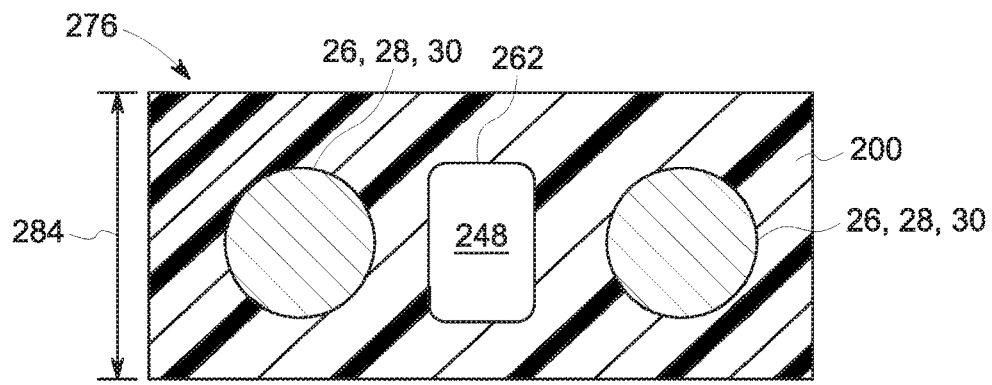
FIG. 23 is a cross-sectional elevation view of an embodiment of the gradient board of FIG. 22 having a dielectric layer, whereby the dielectric layer includes integrated cooling channels and gradient coils.
Figure 24:
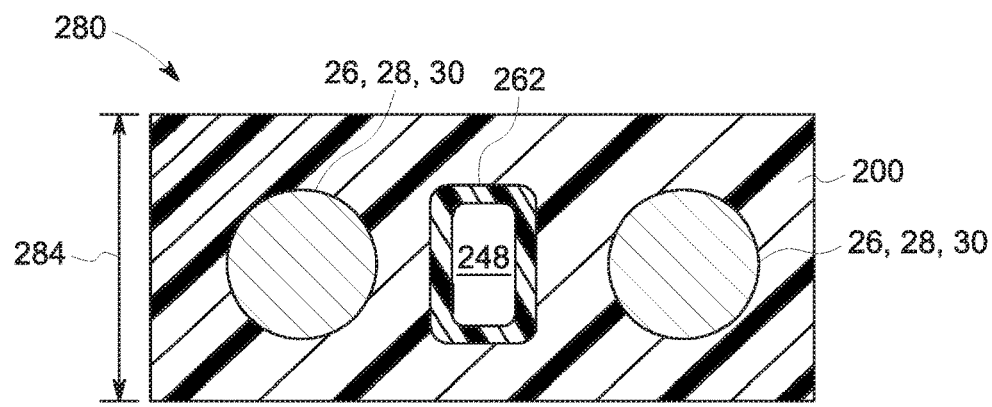
FIG. 24 is a cross-sectional side-view of an embodiment of the gradient board of FIG. 22 having a dielectric layer that includes integrated cooling channels and gradient coils, whereby the integrated cooling channels are coated with a protective barrier.

FIG. 23 illustrates a cross-sectional elevation view of an embodiment of the gradient board 276 having both the gradient coils 26, 28, 30 and the cooling channels 248 within the same layer. In this particular embodiment, the cooling channels 248 and the gradient coils 26, 28, 30 are in the same plane such that the cooling channels 248 and the gradient coils 26, 28, 30 are interleaved or interdigitated (e.g., adjacent to and parallel to one another). The gradient board 280 may include an alternating pattern of the gradient coil 26, 28, 30 and the cooling channel 248. For example, one cooling channel 248 may be positioned between each pair of adjacent gradient coil 26, 28, 30. In other embodiments, one cooling channel 248 may be spaced apart from another cooling channel 248 by two or more gradient coils 26, 28, 30. The cooling channels 248 may be arranged such that that each cooling channel 248 runs parallel to an adjacent gradient coil 26, 28, 30 and has a pattern in the gradient board 276 that is similar to that of the gradient coil 26, 28, 30. The cooling channels 248 may also be coated with the protective barrier 262, as shown in FIG. 24, to mitigate absorption of moisture from the cooling fluid and corrosion of the gradient coils 26, 28, 30.

By positioning the cooling channels 248 in the same layer as the gradient coils 26, 28, 30, a thickness 284 of the gradient board 276 may be decreased compared to gradient boards having the cooling channels 248 in a separate layer (see, e.g., FIG. 22). As such, the gradient board 280 may be compact, which may result in MRI systems having a smaller magnet bore and/or a larger patient bore (e.g., the scanner 12) compared to systems that include gradient boards in which the cooling channels 248 and the gradient coils 26, 28, 30 are in separate layers. Additionally, due, in part, to the proximity of the cooling channels 248 and the gradient coils 26, 28, 30, this arrangement may be more effective for cooling the gradient coils 26, 28, 30.

Figure 25:
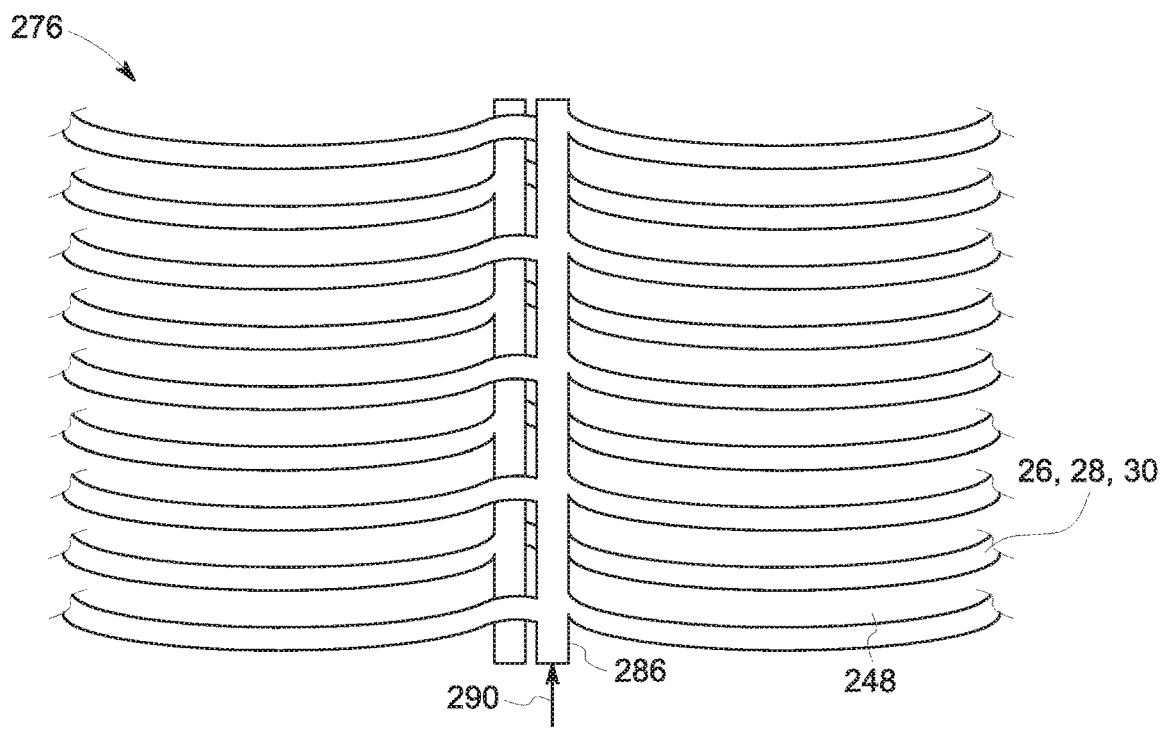
FIG. 25 is a diagrammatical illustration of an embodiment of the gradient board of FIG. 22 having a central cooling channel and a plurality of cooling channels extending away from the central cooling channel.

In certain embodiments, the cooling channels 248 may extend from one or more central channels to decrease a flow path length of the cooling fluid through the gradient board 276. For example, FIG. 25 illustrates a portion of an embodiment of the gradient board 276 having a central cooling channel 286 with multiple of the cooling channels 248 radially extending from the central cooling channel 286. The central cooling channel 286 may receive and supply a cooling fluid 290 to the cooling channels 248. Each cooling channel 248 may be positioned between each gradient coil 26, 28, 30 and follow the pattern of the gradient coils 26, 28, 30. The central cooling channel 286 may distribute the cooling fluid 290 to the cooling channels 248. In this way, a flow path length of the cooling fluid 290 may be decreased, thereby allowing more efficient cooling of the gradient coils 26, 28, 30. The cooling channels 248 may converge to form an outlet channel that allows the cooling fluid 290 to exit the cooling channels 248.

Figure 26:
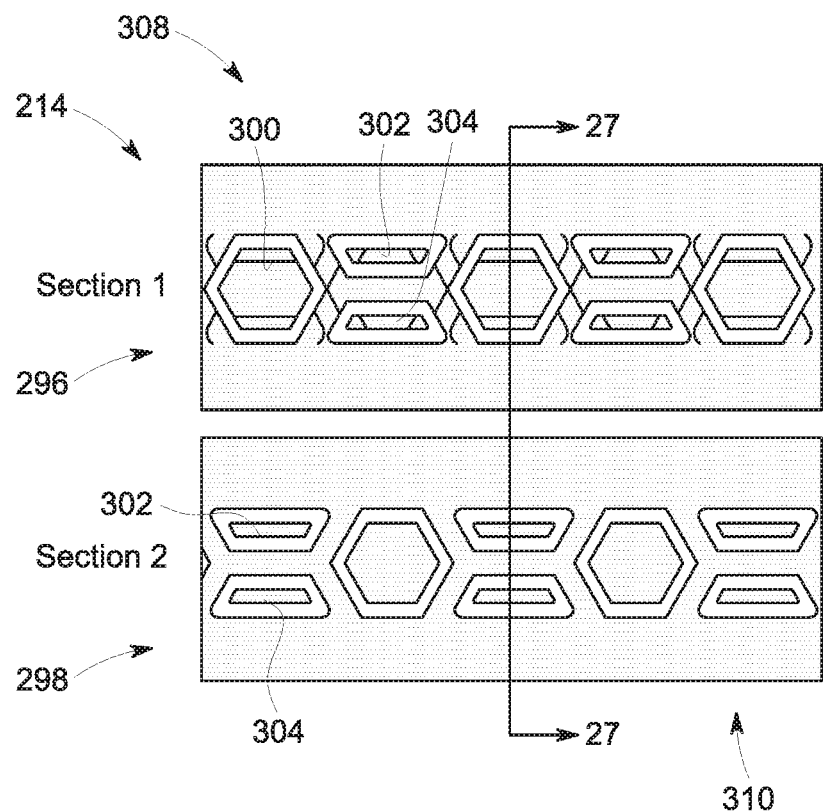
FIG. 26 is a diagrammatical illustration of an embodiment of the gradient board of FIG. 22 having a dielectric layer that includes multiple sections with cooling channels, whereby each section changes a flow path of a cooling fluid flowing through the cooling channels.

In certain embodiments, the cooling channels 248 may be arranged such that a flow path through the cooling channels alternates between a first flow path and a second flow path. For example, FIG. 26 illustrates an embodiment of the gradient board 276 having a first section 296 and a second section 298. The sections 296, 298 are positioned parallel and adjacent to each other such that a flow of the cooling fluid (e.g., the cooling fluid 290) flows through a first cooling channel 300 in the first section 296 and into a second cooling channel 302 and a third cooling channel 304 in the second section 298. During cooling of the gradient board 276, the cooling fluid 290 may flow in a downstream direction (e.g., from a patient end 308 to a service end 310) through the first cooling channel 300 in the first section 296. When the flow of the cooling fluid 290 reaches the second section 298, the flow of the cooling fluid 290 is split by the channels 302, 304. The flow of the cooling fluid 290 exiting the cooling channels 302, 304 may be combined in a subsequent section downstream of the second section 298.

Figure 27:
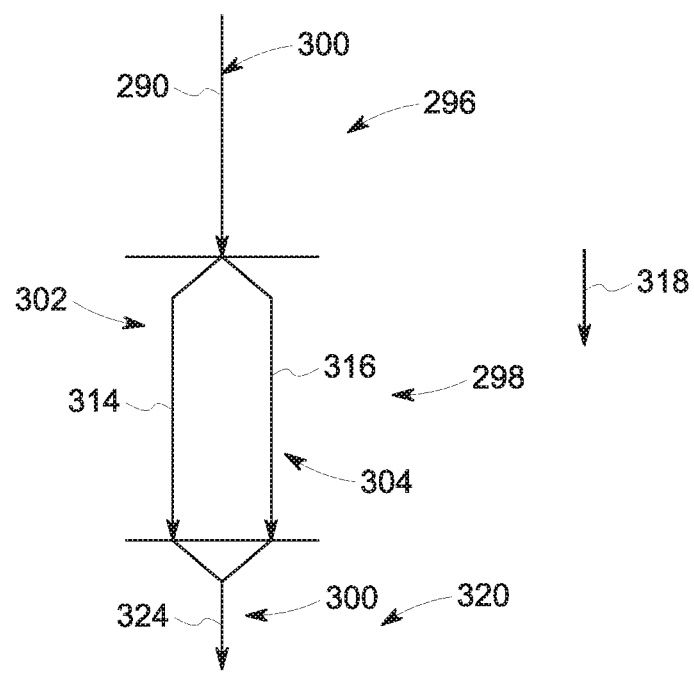
FIG. 27 is a diagrammatical illustration of an embodiment of the flow path of a cooling fluid through the sections of the dielectric layer of FIG. 26.

As the cooling fluid 290 continues through flow toward the service end 310, the flow of the cooling fluid 290 may be alternately split and combined. For example, FIG. 27 illustrates a flow path of the cooling fluid 290 through the gradient board 276 along line 27-27. In the illustrated embodiment, a flow stream of the cooling fluid 290 is split into flow streams 314, 316 by the cooling channels 302, 304, respectively, as the cooling fluid 290 flows from the first section 296 into the second section 298 in a downstream direction 318. As the streams 306, 308 continue to flow in the downstream direction 318, a cooling channel (e.g., the cooling channel 300) in a third section 320 combines the streams 314, 316 into a single stream 324. The flow of the cooling fluid 290 may continue to be split and combined as it flows through the gradient board 276 in the downstream direction 318 toward an outlet of the cooling channels 300, 302, 304. The repetitive bifurcation of flow of the cooling fluid 290 may result in an increase in heat transfer between the cooling fluid 290 and the gradient coils 26, 28, 30. Each section 296, 298, and 320 may have alternating cooling channel configurations that split and combine the flow of the cooling fluid 290, as shown in FIG. 26. For example, the first section 296 includes the cooling channel 300 adjacent to the cooling channels 302, 304. While in the illustrated embodiment, the cooling fluid 290 is split into two flow streams, present embodiments also include cooling channels that split the flow of the cooling fluid into three or more streams.

As discussed above, gradient board having integral cooling channels that are separate from the electrical circuit may be manufactured by using a subtractive process aided by 3D printing. A sacrificial cooling channel template may be 3D printed with a dissolvable polymeric material and potted with a dielectric material. Following curing of the dielectric material, the sacrificial cooling channel template may be dissolved using a suitable solvent to create cooling channels within the cured dielectric material having a geometric pattern and configuration defined by the sacrificial cooling channel template. In this way, the cooling channels may be integrated into the dielectric material used to manufacture gradient boards. By integrating the cooling channels into the dielectric material of the gradient board, a pressure drop associated with cooling channels integrated into the electrical circuit of the gradient board may be mitigated. Additionally, by using the sacrificial cooling channel template, the integrated cooling channels may have geometries and configurations that may improve cooling efficiency of the cooling fluid flowing through the integrated cooling channels.

This written description uses examples to disclose the invention, including the best mode, and also to enable any person skilled in the art to practice the invention, including making and using any devices or systems and performing any incorporated methods. It should also be understood that the various examples disclosed herein may have features that can be combined with those of other examples or embodiments disclosed herein. That is, the present examples are presented in such a way as to simplify explanation but may also be combined one with another. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of manufacturing, comprising:
producing a gradient coil assembly comprising one or more cooling channels for a magnetic resonance imaging system by a process comprising:
printing a cooling channel template having a first end, a second end, and a hollow passage extending between the first end and the second end;
disposing a dielectric material over at least a portion of the cooling channel template to generate a dielectric layer the cooling channel template being embedded at least partly within the dielectric layer; and
removing the cooling channel template from the dielectric layer to thereby produce the one or more cooling channels within the dielectric layer such that the one or more cooling channels have a pattern corresponding to a geometry of the cooling channel template.

2. The method of claim 1, wherein the process comprises flowing a non-reactive solvent through the hollow passage of the cooling channel template to dissolve and remove the cooling channel template from the dielectric layer.

3. The method of claim 2, wherein the non-reactive solvent comprises water, a sodium hydroxide solution, xylene, or D-limonene.

4. The method of claim 1, wherein the cooling channel template is printed from a dissolvable plastic material comprising polyvinyl alcohol (PVA), high impact polystyrene (HIPS), wax, a terpolymer of methacrylic acid, styrene, and butylacrylate, acrylic copolymer, or combinations thereof.

5. The method of claim 1, wherein the process comprises depositing a protective barrier on an inner wall of the one or more cooling channels, wherein the protective barrier is configured to block absorption of moisture by the dielectric material and corrosion of the gradient coil assembly.

6. The method of claim 5, wherein the protective barrier is deposited on the inner wall after removal of cooling channel template.

7. The method of claim 5, wherein depositing the protective barrier on the inner wall of the one or more cooling channels comprises coating the protective barrier onto an outer wall of the cooling channel template, and transferring the protective barrier to the one or more cooling channels during deposition of the dielectric material on the cooling channel template.

8. The method of claim 5, wherein the protective barrier comprises polyurethane, an acrylic polymer, parylene, or combinations thereof.

9. The method of claim 1, wherein the dielectric material comprises a polyurethane resin, an epoxy resin, ceramic, an epoxy-ceramic resin, or combinations thereof.

10. The method of claim 1, wherein the dielectric material comprises a filler comprising calcium carbonate, boron nitride, aluminum nitride, or combinations thereof.

11. The method of claim 1, wherein the gradient coil assembly comprises a first gradient layer and a second gradient layer, each of the first and second gradient layers having one or more gradient coils, and wherein the dielectric layer having the one or more cooling channels is disposed between the first and second gradient layers.

12. The method of claim 1, wherein the dielectric layer comprises one or more gradient coils, and wherein each gradient coil of the one or more gradient coils is positioned adjacent to at least one channel of the one or more cooling channels.

13. The method of claim 1, wherein an inner wall of the one or more cooling channels comprises one or more protrusions or recesses.

14. A method, comprising:
    printing a dissolvable polymeric material onto a working surface of a 3D printing system to generate a cooling channel template having a pattern representative of one or more cooling channels of a gradient board, wherein the cooling channel template comprises a first end, a second end, and a hollow passage extending between the first end and the second end;
    potting the cooling channel template with a dielectric material to generate a dielectric layer the cooling channel template being embedded at least partly within the dielectric layer;
    removing the cooling channel template from the dielectric layer to generate a dielectric layer having a plurality of integral cooling channels created by removal of the cooling channel template; and
    integrating the dielectric layer into the gradient board, the gradient board having gradient coils for a magnetic resonance imaging (MM) system.

15. The method of claim 14, comprising flowing a non-reactive solvent through the hollow passage of the cooling channel template, wherein the non-reactive solvent dissolves and removes the dissolvable polymeric material from the dielectric layer while leaving the dielectric layer intact.

16. The method of claim 14, comprising depositing a protective barrier on an inner wall of the plurality of integral cooling channels, wherein the protective barrier is configured to block absorption of moisture and corrosion of the gradient board.

17. The method of claim 14, comprising:
    coating an outer wall of the cooling channel template with a protective barrier to generate a coated cooling channel template; and
    transferring the protective barrier from the coated cooling channel template to an inner wall of the plurality of integral cooling channels.

* * * * *